US011887648B2

(12) United States Patent
Hong et al.

(10) Patent No.: US 11,887,648 B2
(45) Date of Patent: Jan. 30, 2024

(54) SEMICONDUCTOR MEMORY DEVICES

(71) Applicant: SAMSUNG ELECTRONICS CO., LTD., Suwon-si (KR)

(72) Inventors: Jaeho Hong, Hwaseong-si (KR); Hyuncheol Kim, Seoul (KR); Yongseok Kim, Suwon-si (KR); Ilgweon Kim, Hwaseong-si (KR); Hyeoungwon Seo, Yongin-si (KR); Sungwon Yoo, Hwaseong-si (KR); Kyunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 45 days.

(21) Appl. No.: 17/362,138

(22) Filed: Jun. 29, 2021

(65) Prior Publication Data
US 2022/0108741 A1    Apr. 7, 2022

(30) Foreign Application Priority Data
Oct. 7, 2020   (KR) .......................... 10-2020-0129507

(51) Int. Cl.
*H01L 29/66* (2006.01)
*G11C 11/39* (2006.01)
(Continued)

(52) U.S. Cl.
CPC .......... *G11C 11/4023* (2013.01); *G11C 11/39* (2013.01); *H01L 27/1027* (2013.01); *H01L 29/66363* (2013.01); *H01L 29/749* (2013.01)

(58) Field of Classification Search
CPC ........ H10B 41/27; H10B 43/27; G11C 11/39; G11C 11/4023
See application file for complete search history.

(56) References Cited

U.S. PATENT DOCUMENTS 9,343,462 B2    5/2016  Tang
10,381,362 B1 *  8/2019  Cui ........................ H10B 43/40
(Continued)

FOREIGN PATENT DOCUMENTS

CN   107564915   11/2018
CN   108807411   11/2018
(Continued)

*Primary Examiner* — Meiya Li
(74) *Attorney, Agent, or Firm* — F. CHAU & ASSOCIATES, LLC

(57) ABSTRACT

A semiconductor memory device according to the present inventive concept includes: a semiconductor substrate; a common source semiconductor layer doped with impurities of a first conductivity type on the semiconductor substrate; a plurality of insulating layers and a plurality of word line structures alternately stacked on the common source semiconductor layer; and a memory cell dielectric layer penetrating the plurality of insulating layers and the plurality of word line structures and covering an internal wall of a channel hole extending in a vertical direction, and a memory cell structure filling the channel hole. The memory cell structure includes a channel layer, which has the memory cell dielectric layer thereon and fills at least a portion of the channel hole, and a drain layer covering an upper surface of the channel layer, doped with impurities of a second conductivity type, and filling some of an upper portion of the channel hole.

18 Claims, 37 Drawing Sheets

(51) Int. Cl.
   *G11C 11/402*     (2006.01)
   *H01L 29/749*     (2006.01)
   *H01L 27/102*     (2023.01)

(56)                References Cited

U.S. PATENT DOCUMENTS 10,424,384  B2    9/2019   Higashi et al.
   10,636,473  B2    4/2020   Luan
   2012/0205719 A1   8/2012   Tang
   2017/0025421 A1*  1/2017   Sakakibara ............ H10B 41/27
   2017/0229465 A1   8/2017   Luan et al.
   2018/0053768 A1   2/2018   Luan et al.
   2019/0013317 A1   1/2019   Luan et al.
   2022/0238548 A1*  7/2022   Liu ........................ H10B 43/27

FOREIGN PATENT DOCUMENTS

KR      10-1804688       11/2017
   TW         I682525        1/2020

* cited by examiner

SEMICONDUCTOR MEMORY DEVICES

CROSS-REFERENCE TO RELATED APPLICATION

This application claims priority under 35 U.S.C. § 119 to Korean Patent Application No. 10-2020-0129507, filed on Oct. 7, 2020, in the Korean Intellectual Property Office, the disclosure of which is incorporated by reference herein in its entirety.

TECHNICAL FIELD

The present inventive concept relates to a semiconductor memory device, and more particularly, to a capacitorless semiconductor memory device.

DISCUSSION OF RELATED ART

Electronic devices have become more compact and lightweight, in accordance with the rapid development of the electronics industry and constant demand for high-performance electronic systems by users. Accordingly, semiconductor devices, which are main components of the electronic devices, are required to have high integration and high capacity.

Among semiconductor memory devices, a dynamic random-access memory (DRAM) device includes a capacitor, but because it is difficult to reduce capacitance of the capacitor to perform a memory function, there is a limit to high integration.

SUMMARY

The present inventive concept provides a capacitorless semiconductor memory device capable of high integration.

The present inventive concept provides semiconductor memory devices as follows. A semiconductor memory device according to an embodiment of the present inventive concept includes: a semiconductor substrate; a common source semiconductor layer doped with impurities of a first conductivity type and arranged on the semiconductor substrate; a plurality of insulating layers and a plurality of word line structures alternately stacked on the common source semiconductor layer; and a memory cell dielectric layer penetrating the plurality of insulating layers and the plurality of word line structures and covering an internal wall of a channel hole extending in a vertical direction, and a memory cell structure filling the channel hole, in which the memory cell structure includes a channel layer, which has the memory cell dielectric layer disposed thereon and fills at least a portion of the channel hole, and a drain layer covering an upper surface of the channel layer, doped with impurities of a second conductivity type, and filling some of an upper portion of the channel hole, and the memory cell dielectric layer includes a gate insulating layer covering the internal wall of the channel hole, and a charge trap layer arranged between the gate insulating layer and the channel layer.

A semiconductor memory device according to an embodiment of the present inventive concept includes: a semiconductor substrate; a plurality of memory cell structures each including a cell source layer, a channel layer, and a drain layer sequentially stacked from the semiconductor substrate in a vertical direction, and each having a vertical pillar shape extending in the vertical direction; a plurality of word line structures being apart from each other in the vertical direction and surrounding the plurality of memory cell structures; a plurality of memory cell dielectric layers each interposed between the channel layer of each of the plurality of memory cell structures and the plurality of word line structures, respectively; and a plurality of bit lines each electrically connected to the drain layer of each of the plurality of memory call structures, respectively, extending in a first horizontal direction on the plurality of word line structures, and having a certain distance from each other in a second horizontal direction orthogonal to the first horizontal direction, in which the drain layer is doped with impurities of a first conductivity type, and the cell source layer is doped with impurities of a second conductivity type different from the first conductivity type, and each of the plurality of memory cell dielectric layers includes: a gate insulating layer covering the plurality of word line structures; and a charge trap layer arranged between the gate insulating layer and the channel layer.

A semiconductor memory device according to an embodiment of the present inventive concept includes: a semiconductor substrate; an etch stop layer arranged on the semiconductor substrate; a common source semiconductor layer doped with impurities of a first conductivity type and arranged on the semiconductor substrate; a plurality of insulating layers and a plurality of word line structures alternately stacked on the common source semiconductor layer; a memory cell dielectric layer including a gate insulating layer and a charge trap layer sequentially covering an internal sidewall of each of a plurality of channel holes that penetrate the plurality of insulating layers, the plurality of word line structures, and the etch stop layer in a vertical direction and extend into the semiconductor substrate; a plurality of memory cell structures each including: a filling semiconductor layer having a barrier insulating layer arranged thereon, located apart from the memory cell dielectric layer, and filling some of a lower portion of each of the plurality of channel holes; a channel layer having the memory cell dielectric layer arranged thereon, being apart from the filling semiconductor layer with the common source semiconductor layer arranged therebetween, filling a portion of each of the channel holes, and including a material identical to that of the filling semiconductor layer; and a drain layer covering the upper surface of the channel layer, filling some of an upper portion of each of the channel holes, and doped with impurities of a second conductivity type different from the first conductivity type; and a plurality of bit lines each electrically connected to the drain layer of each of the plurality of memory cell structures, respectively, extending on the plurality of memory cell structures in a first horizontal direction, and having a certain distance from each other in a second horizontal direction orthogonal to the first horizontal direction.

BRIEF DESCRIPTION OF THE DRAWINGS

Embodiments of the present inventive concept will be more clearly understood from the following detailed description taken in conjunction with the accompanying drawings in which.

Figure 1A:
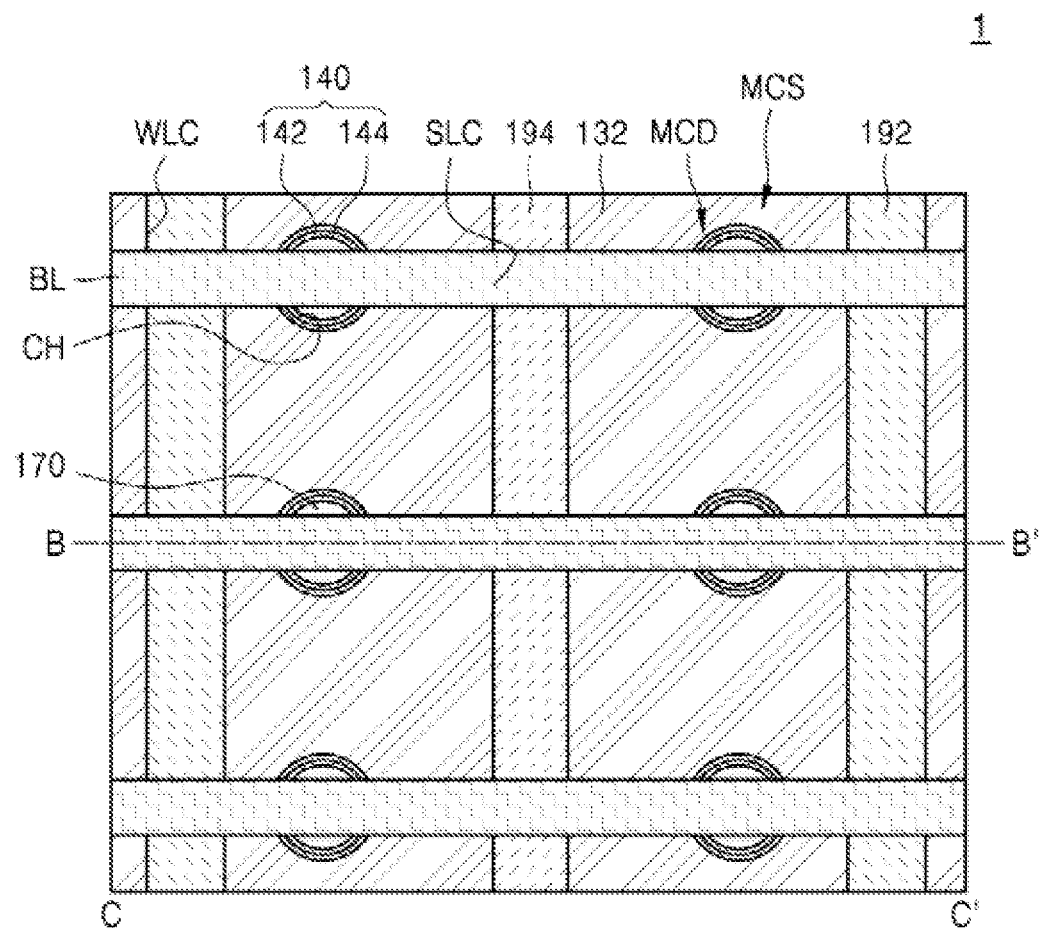
FIGS. 1A and 1C are top views and FIG. 1B is a cross-sectional view of a semiconductor memory device, according to an embodiment of the present inventive concept.

Since the drawings in FIGS. 1A-17 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 1B:
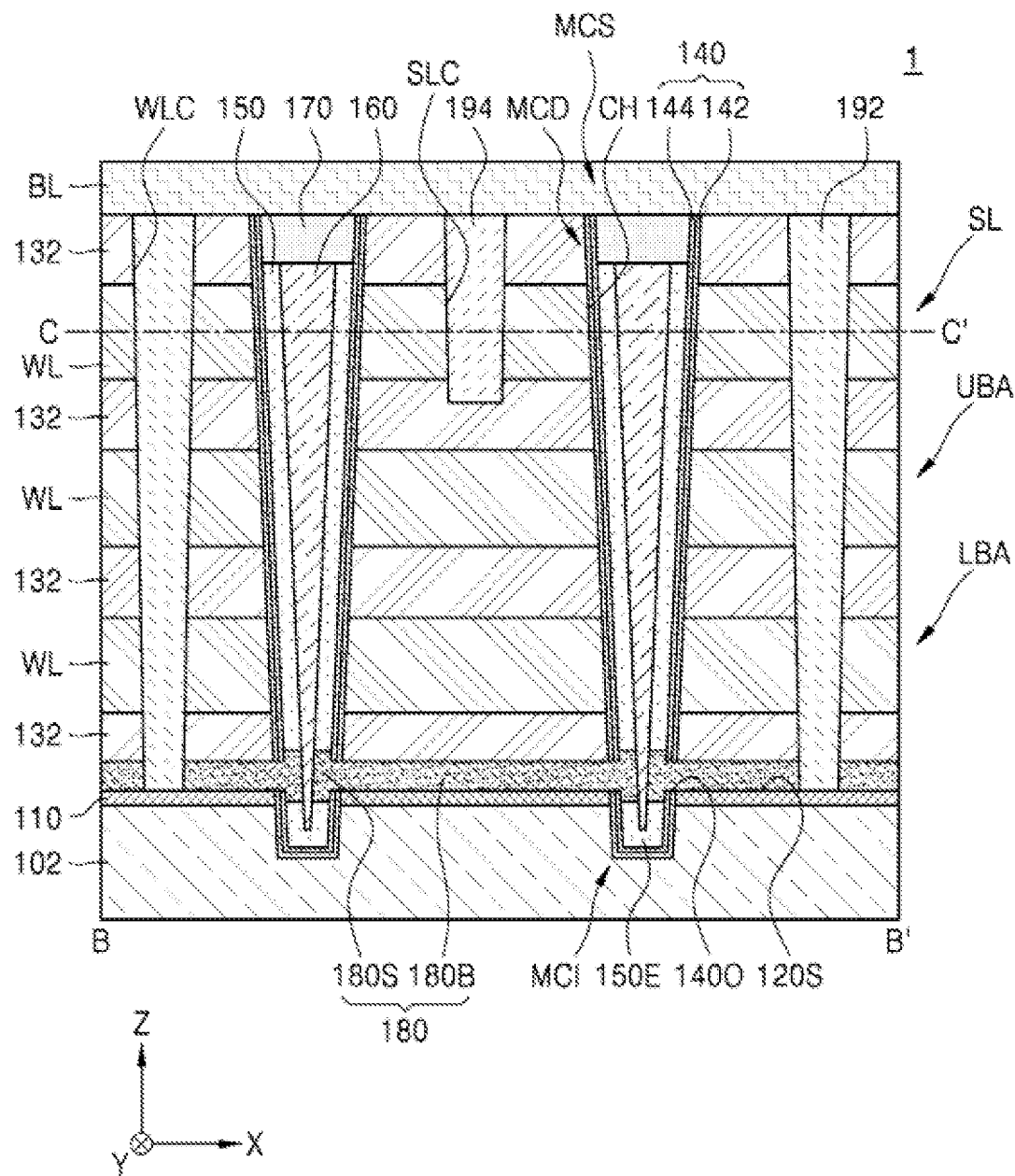
Figure 1C:
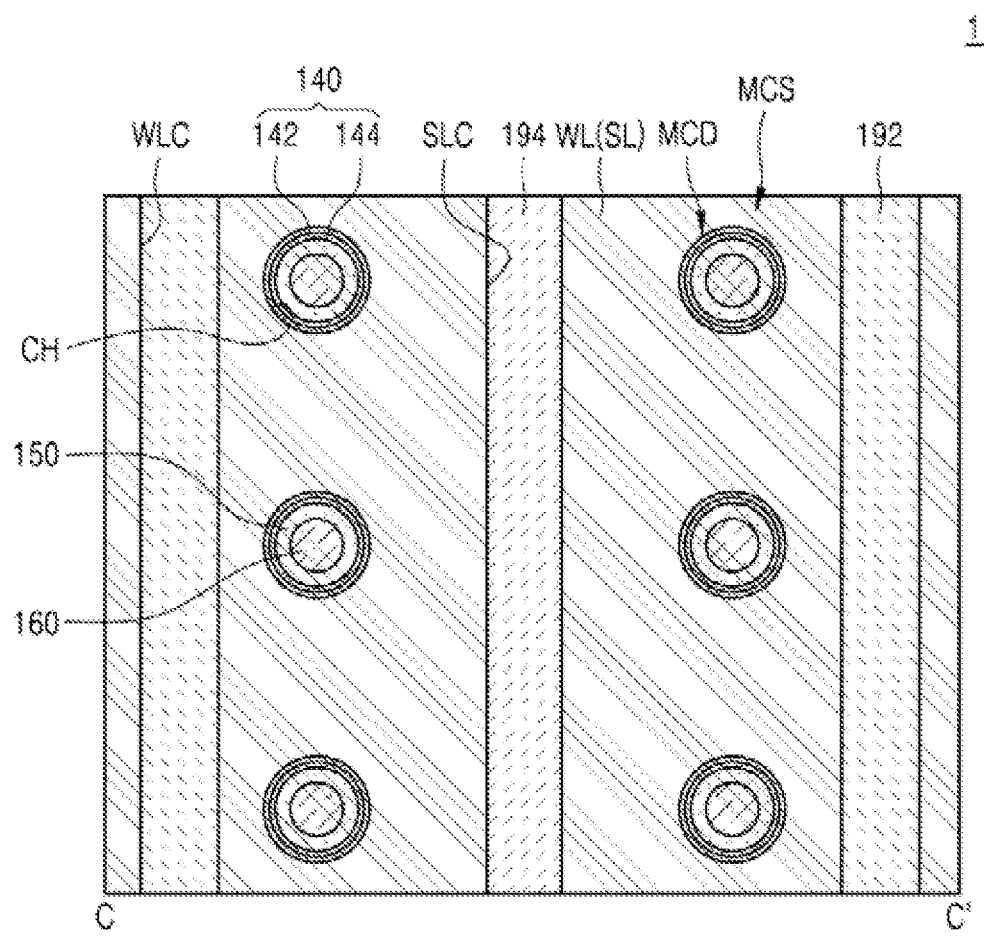
Figure 1D:
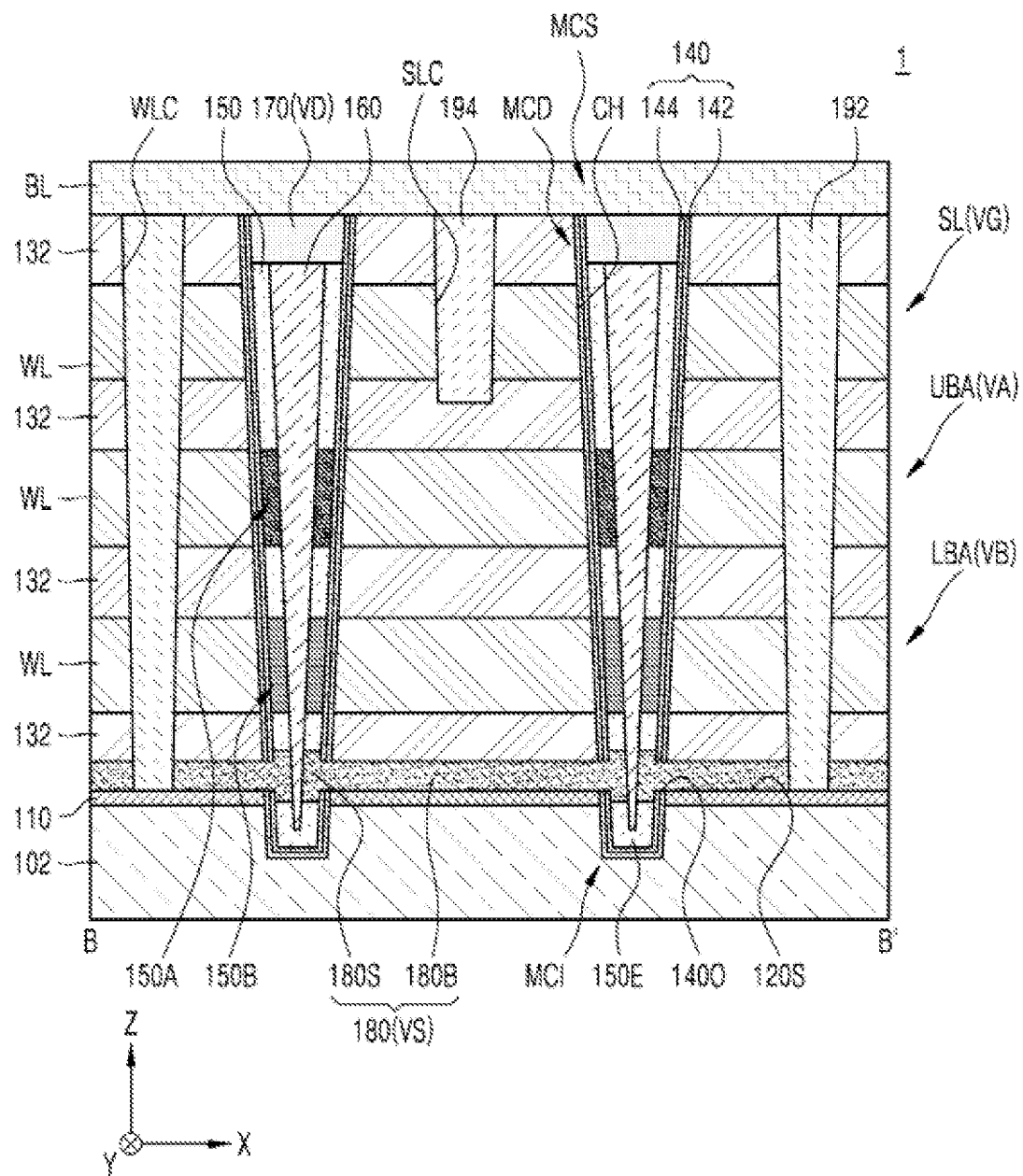
FIG. 1D is a cross-sectional view of a semiconductor memory device for describing an operation thereof, according to an embodiment of the present inventive concept.

FIGS. 1A and 1C are top views and FIG. 1B is a cross-sectional view of a semiconductor memory device, according to an embodiment of the present inventive concept, and FIG. 1D is a cross-sectional view of a semiconductor memory device for describing an operation thereof, according to an embodiment of the present inventive concept. FIG. 1A is a top view of a semiconductor memory device, FIGS. 1B and 1D are cross-sectional views taken along line B-B' in FIG. 1A, and FIG. 1C is a cross-sectional view taken along line C-C' in FIG. 1B of a semiconductor memory device, according to an embodiment of the present inventive concept.

Referring to FIGS. 1A through 1C together, a semiconductor memory device 1 may include a common source semiconductor layer 180 arranged on a semiconductor substrate 102, a plurality of insulating layers 132 arranged on the common source semiconductor layer 180 and being apart from each other in a vertical direction (Z direction), a plurality of word line structures WL placed between the plurality of insulating layers 132 and being apart from each other in the vertical direction (Z direction), and a plurality of memory cell structures MCS extending in the vertical direction (Z direction). For example, the plurality of insulating layers 132 and the plurality of word line structures WL may be alternately stacked on the common source semiconductor layer 180 arranged on the semiconductor substrate 102. The plurality of memory cell structures MCS may be placed inside a plurality of channel holes CH which penetrate the plurality of insulating layers 132, the plurality of word line structures WL, and the plurality of common source semiconductor layers 180, and extend into the semiconductor substrate 102. An etch stop layer 110 may be placed between the semiconductor substrate 102 and the common source semiconductor layer 180. Accordingly, the channel hole CH may also penetrate through the etch stop layer 110. In an embodiment of the present inventive concept, the plurality of channel holes CH may be arranged in a matrix form. Alternatively, the plurality of channel holes CH may be arranged to form a hexagonal array.

The semiconductor substrate 102 may include, for example, silicon (Si), for example, crystalline Si (c-Si), polycrystalline Si (p-Si), or amorphous Si (p-Si). Alternatively, the semiconductor substrate 102 may include a semiconductor element such as germanium (Ge), or at least one compound semiconductor of silicon germanium (SiGe), silicon carbide (SiC), gallium arsenide (GaAs), indium arsenide (InAs), indium antimonide (InSb), lead tellurium (PbTe) compounds, gallium antimonide (GaSb), indium phosphide (InP), or indium gallium arsenide (InGaAs). Alternatively, the semiconductor substrate 102 may include a silicon-on-insulator (SOI) substrate, a silicon germanium-on-insulator (SGOI) substrate, or a germanium-on-insulator (GOI) substrate. For example, the semiconductor substrate 102 may include a buried oxide (BOX) layer. The semiconductor substrate 102 may include a conductive region, for example, a well doped with an impurity, or a structure doped with an impurity. In addition, the substrate 10 may include one or more semiconductor layers or structures and may include active or operable portions of semiconductor devices. The semiconductor substrate 102 may have a main surface extending in both a first horizontal direction (X direction) and a second horizontal direction (Y direction) orthogonal to the first horizontal direction (X direction) (e.g., on X-Y plane).

In an embodiment of the present inventive concept, a device isolation layer may be formed on the semiconductor substrate 102. The device isolation layer may include at least one of, for example, a silicon oxide ($SiO_2$) layer, a silicon nitride ($Si_3N_4$) layer, or a silicon oxynitride (SiON) layer. The device isolation layer may include a single layer including one kind of an insulating layer, a double layer including two kinds of insulating layers, or a multiple layer including a combination of at least three kinds of insulating layers. For example, the device isolation layer may include two different kinds of insulating layers such as, for example, a silicon oxide ($SiO_2$) layer and a silicon nitride ($Si_3N_4$) layer. For example, the device isolation layer may include a triple layer including a silicon oxide ($SiO_2$) layer, a silicon nitride ($Si_3N_4$) layer, and a silicon oxide ($SiO_2$) layer. The device isolation layer may include a shallow trench isolation (STI) structure. In an embodiment of the present inventive concept, a device isolation trench may be formed by removing an upper portion of the semiconductor substrate 102 through an anisotropic etching process, and then an insulating film including, for example, silicon oxide ($SiO_2$), silicon nitride ($Si_3N_4$), and/or silicon oxynitride (SiON) may be provided to fill the device isolation trench to form the device isolation layer.

The etch stop layer 110 may include oxynitride. For example, the etch stop layer 110 may include silicon oxynitride (SiON). The insulating layer 132 may include oxide. For example, the insulating layer 132 may include silicon oxide ($SiO_2$).

The plurality of word line structures WL may extend in a horizontal direction (X direction or Y direction) on the semiconductor substrate 102, and overlap each other in a vertical direction (Z direction) perpendicular to the semiconductor substrate 102. The word line structure WL may include a metal such as, for example, tungsten (W), nickel (Ni), cobalt (Co), and/or tantalum (Ta), a metal silicide such as, for example, tungsten silicide ($WSi_x$), nickel silicide ($NiSi_x$), cobalt silicide ($CoSi_x$), and/or tantalum silicide ($TaSi_x$), polysilicon (p-Si) doped with impurities, or a combination thereof. In an embodiment of the present inventive concept, the word line structure WL may further include a diffusion barrier, and the diffusion barrier may include, for example, tungsten nitride (WN), tantalum nitride (TaN), and/or titanium nitride (TiN).

In an embodiment of the present inventive concept, a width of each of the plurality of channel holes CH in the horizontal direction (X direction or Y direction) may have a tapered shape in which the width thereof becomes smaller toward the semiconductor substrate 102. This may be due to the characteristics of the etching process for forming the channel holes CH. In an embodiment of the present inventive concept, the width of each of the plurality of channel holes CH in the horizontal direction (X direction or Y direction) may have a maximum width at a lower end than at the uppermost end of each of the plurality of channel holes CH, and may become smaller from a portion having the maximum width toward the semiconductor substrate 102. In other words, the portion having the maximum width is located between the lowermost end and the uppermost end of each of the plurality of channel holes CH.

A memory cell dielectric layer MCD may be placed between the plurality of word line structures WL and a channel layer 150. The memory cell structures MCS may include the channel layers 150 that include the memory cell dielectric layers MCD disposed therebetween or thereon and cover at least portions of the channel holes CH, and drain layers 170 that cover upper surfaces of the channel layers 150 and fill portions of upper sides of the channel holes CH. For example, the memory cell dielectric layer MCD may be disposed on a sidewall of the channel layer 150, and may be interposed between the channel layer 150 and the plurality of word line structures WL. As to be described later, the memory cell structure MCS may further include a cell source layer 180S. In an embodiment of the present inventive concept, the channel layers 150 may each have a cylindrical shape in which a memory cell dielectric layer MCD is arranged thereon, and may cover internal walls of the channel holes CH. The memory cell structure MCS may further include a filling insulating layer 160 filling the inside of the channel layer 150 of the cylindrical shape. For example, the channel layer 150 may have a circular tube shape, and filling insulating layer 160 may have a pillar shape. In an embodiment of the present inventive concept, the channel layer 150 may have a substantially constant thickness and may conformally cover the memory cell dielectric layer MCD. The memory cell dielectric layer MCD may surround an outer wall of the channel layer 150. In many instances throughout the specification, the term "cover" or "on", may mean covering or on the sidewall of the subject, or may mean covering or on the subject from below.

An upper surface of the channel layer 150 may contact the drain layer 170, and a lower surface of the channel layer 150 may contact the common source semiconductor layer 180. A buried semiconductor layer 150E may fill a lower portion of the channel hole CH extending into the semiconductor substrate 102. The buried semiconductor layer 150E may also be referred to as a filling semiconductor layer. The buried semiconductor layer 150E may be apart from the channel layer 150 with the common source semiconductor layer 180 disposed therebetween. In an embodiment of the present inventive concept, the filling insulating layer 160 may penetrate the common source semiconductor layer 180 from the inside of the channel layer 150 and extend into the buried semiconductor layer 150E. In the lower portion of the channel hole CH, for example, the portion inside the semiconductor substrate 102, a barrier insulating layer MCI may be placed between the buried semiconductor layer 150E and the semiconductor substrate 102. In an embodiment of the present inventive concept, the barrier insulating layer MCI may cover the semiconductor substrate 102 and the etch stop layer 110 in the lower portion of the channel hole CH. The barrier insulating layer MCI may surround side surfaces and a lower surface of the buried semiconductor layer 150E.

In an embodiment of the present inventive concept, the channel layer 150 may include an intrinsic semiconductor material that is not doped with impurities. For example, the channel layer 150 may include intrinsic polysilicon (p-Si). In an embodiment of the present inventive concept, the channel layer 150 may include polysilicon (p-Si) of a relatively low doping concentration of p0.

The buried semiconductor layer 150E may include a material the same as that of the channel layer 150. For example, the buried semiconductor layer 150E may include an intrinsic semiconductor material. In an embodiment of the present inventive concept, the buried semiconductor layer 150E may include intrinsic polysilicon (p-Si) which is not doped with impurities. In an embodiment of the present inventive concept, the buried semiconductor layer 150E may include polysilicon (p-Si) having a doping concentration lower than the doping concentration of the channel layer 150. For example, the doping concentration of the buried semiconductor layer 150E may be lower than the relatively low doping concentration of p0 which is the concentration of impurities doped in the channel layer 150.

The drain layer 170 may include a semiconductor material doped with impurities of a first conductivity type. In an embodiment of the present inventive concept, the first conductivity type may be a p-type. For example, the drain layer 170 may include p+ polysilicon (p-Si) doped with p-type impurities (e.g., boron (B), aluminum (Al), gallium (Ga), etc.) at a high concentration. The common source semiconductor layer 180 may include a semiconductor material doped with impurities of a second conductivity type different from the first conductivity type. In an embodiment of the present inventive concept, the second conductivity type may be an n-type. For example, the common source semiconductor layer 180 may include n+ polysilicon (p-Si) doped with n-type impurities (e.g., phosphorus (P), arsenic (As), etc.) at a high concentration.

In an embodiment of the present inventive concept, the memory cell dielectric layer MCD may extend from the common source semiconductor layer 180 to the drain layer 170 along the internal wall of the channel hole CH. For example, the memory cell dielectric layer MCD may have a substantially constant thickness and may conformally cover the internal wall of the channel hole CH. In an embodiment of the present inventive concept, a plurality of memory cell dielectric layers MCD may each be arranged between the plurality of word line structures WL and the channel layer 150, and may be apart from each other.

The memory cell dielectric layer MCD and the barrier insulating layer MCI may include a stacked insulating structure 140 which includes a gate insulating layer 142 and a charge trap layer 144. For example, the barrier insulating layer MCI may include materials identical to those of the memory cell dielectric layer MCD. For example, the barrier insulating layer MCI may have a substantially constant thickness and may conformally cover the internal wall and the bottom surface of the channel hole CH extending into the semiconductor substrate 102. The gate insulating layer 142 may contact the word line structure WL, and the charge trap layer 144 may be apart from the word line structure WL with the gate insulating layer 142 interposed therebetween. The charge trap layer 144 may contact the channel layer 150, and the gate insulating layer 142 may be apart from the channel layer 150 with the charge trap layer 144 interposed therebetween.

In an embodiment of the present inventive concept, the gate insulating layer 142 may conformally cover the internal wall of the channel hole CH, and the charge trap layer 144 may conformally cover the gate insulating layer 142 which covers the internal wall of the channel hole CH. In an embodiment of the present inventive concept, a plurality of gate insulating layers 142 may respectively cover the plurality of word line structures WL exposed to the internal walls of the channel holes CH, and may be apart from each other, and a plurality of charge trap layers 144 may respectively cover the plurality of gate insulating layers 142. In an embodiment of the present inventive concept, the gate insulating layer 142 may conformally cover the internal wall of the channel hole CH, and the plurality of charge trap layers 144 may respectively face the plurality of word line structures WL and be apart from each other, and may have the gate insulating layers 142 interposed therebetween.

The gate insulating layer 142 may include a material of a relatively low trap site density, and the charge trap layer 144 may include a material of a relatively high trap site density. For example, the charge trap layer 144 may include a material having trap site density and permittivity higher than those of a material included in the gate insulating layer 142. For example, the gate insulating layer 142 may include silicon oxide ($SiO_2$). In an embodiment of the present inventive concept, the charge trap layer 144 may include a high-k material having a dielectric constant higher than that of the gate insulating layer 142. For example, the charge trap layer 144 may include at least one of silicon nitride ($Si_3N_4$), hafnium oxide ($HfO_2$), aluminum oxide ($Al_2O_3$), zirconium oxide ($ZrO_2$), yttrium oxide ($Y_2O_3$), lanthanum oxide ($La_2O_3$), lanthanum aluminum oxide ($LaAlO_3$), hafnium silicon oxynitride (HfSiON), hafnium oxynitride (HfON), or hafnium aluminum oxide ($HfAlO_3$). In an embodiment of the present inventive concept, the charge trap layer 144 may include a dielectric layer doped with transition metal atoms. For example, the charge trap layer 144 may include hafnium oxide ($HfO_2$) doped with transition metal atoms such as, for example, tantalum (Ta), vanadium (V), ruthenium (Ru), niobium (Nb), manganese (Mn), palladium (Pd), iridium (Ir), and antimony (Sb), or aluminum oxide ($Al_2O_3$) doped with transition metal atoms such as, for example, zinc (Zn), tungsten (W), molybdenum (Mo), ruthenium (Ru), hafnium (Hf), nickel (Ni), and platinum (Pt), or with silicon (Si).

The stacked insulating structure 140 may have a channel opening 140O positioned at a vertical level the same as that of a portion between the semiconductor substrate 102 and the lowermost insulating layer 132 of the plurality of insulating layers 132. For example, the channel opening 140O may be positioned at a vertical level the same as that of a base source layer 180B to be described located between the etch stop layer 110 and the lowermost insulating layer 132 of the plurality of insulating layers 132. The channel opening 140O may extend along the internal wall of the channel hole CH and completely surround a portion of the lower side of the channel hole CH.

The memory cell dielectric layer MCD and the barrier insulating layer MCI may include the channel opening 140O disposed therebetween and be apart from each other. Each of the memory cell dielectric layer MCD and the barrier insulating layer MCI may be a portion of the stacked insulating structure 140 positioned on an upper side and a lower side of the channel opening 140O. A portion of the gate insulating layer 142 and a portion of the charge trap layer 144 constituting the memory cell dielectric layer MCD may be referred to as a first gate insulating layer and a first charge trap layer, respectively, and a portion of the gate insulating layer 142 and a portion of the charge trap layer 144 constituting the barrier insulating layer MCI may be referred to as a second gate insulating layer and a second charge trap layer, respectively. Accordingly, the first gate insulating layer and the second gate insulating layer may include the channel opening 140O disposed therebetween and be apart from each other, and the first charge trap layer and the second charge trap layer may include the channel opening 140O disposed therebetween and be apart from each other.

The common source semiconductor layer 180 may include a base source layer 180B extending in the horizontal directions (X and Y directions) between the etch stop layer 110 and the lowermost insulating layer 132 of the plurality of insulating layers 132, and the cell source layer 180S extending from the base source layer 180B and arranged between the channel layer 150 and the buried semiconductor layer 150E in the channel hole CH. In the channel hole, the filling insulating layer 160 may penetrate the cell source layer 180S, and may extend into the buried semiconductor layer 150E. An upper surface of the cell source layer 180S may contact the lower surface of the channel layer 150, and a lower surface of the cell source layer 180S may contact the upper surface of the buried semiconductor layer 150E.

The base source layer 180B may extend with substantially the same vertical height from between the etch stop layer 110 and the lowermost insulating layer 132 of the plurality of insulating layers 132 to the channel opening 140O. The base source layer 180B may fill an internal space 120S between the etch stop layer 110 and the lowermost insulating layer 132 of the plurality of insulating layers 132. In an embodiment of the present inventive concept, a vertical height of the cell source layer 180S may be greater than that of the base source layer 180B. For example, the lower surface of the cell source layer 180S may be located at a vertical level lower than that of a lower surface of the base source layer 180B, and the upper surface of the cell source layer 180S may be located at a vertical level higher than that of an upper surface of the base source layer 180B. For example, the common source semiconductor layer 180 may include the base source layer 180B extending with substantially the same vertical height on a horizontal plane (XY plane), and the cell source layer 180S extending from the base source layer 180B and extending to the upper side and the lower side of the channel hole CH inside the channel hole CH. For example, the base source layer 180B may have the upper surface having a vertical height identical to that of a lower surface of the lowermost insulating layer 132 of the plurality of insulating layers 132 and may extend in the horizontal direction (X direction or Y direction). The cell source layer 180S may extend in the vertical direction (Z direction) upward and downward inside the channel hole CH, and thus, a vertical height of the upper surface of the cell source layer 180S may be higher than a vertical height of the upper surface of the base source layer 180B. For example, a vertical height of the upper surface of the base source layer 180B may be lower than a vertical height of the upper surface of the cell source layer 180S.

Each of the plurality of memory cell structures MCS may include the cell source layer 180S and the drain layer 170 which are apart from each other in the vertical direction (Z direction), and the channel layer 150 placed between the cell source layer 180S and the drain layer 170. The cell source layers 180S, which are included in the plurality of memory cell structures MCS, may be connected to each other by the base source layer 180B. For example, the base source layer 180B may be arranged on the semiconductor substrate 102 (e.g., on the etch stop layer 110), and may connect the cell source layer 180S included in each of the plurality of memory cell structures MCS to an other cell source layer 180S next to the cell source layer 180S. In other words, the memory cell structure MCS may have a vertical pillar shape in which the cell source layer 180S, the channel layer 150, and the drain layer 170 are sequentially stacked from the semiconductor substrate 102 in the vertical direction (Z direction) and placed inside the channel hole CH. The plurality of word line structures WL may be apart from each other in the vertical direction (Z direction) and may surround the memory cell structure MCS. The memory cell dielectric layer MCD may be disposed on a sidewall of the channel layer 150, and may be placed between the channel layer 150 of the memory cell structure MCS and the plurality of word line structures WL.

A word line cut region WLC may penetrate the plurality of insulating layers 132, the plurality of word line structures WL, and the base source layer 180B of the common source semiconductor layer 180. The word line cut region WLC may be arranged apart from the plurality of memory cell structures MCS. For example, the etch stop layer 110 may be exposed to a bottom of the word line cut region WLC. In an embodiment of the present inventive concept, the word line cut region WLC may extend in a second horizontal direction (Y direction). For example, a plurality of word line cut regions WLC may extend in the second horizontal direction (Y direction) to cut a cell array region to form a plurality of memory cell blocks. Thus, each of the plurality of memory cell blocks may be formed between two adjacent word line cut regions WLC. The buried insulating layer 192 may fill the word line cut region WLC. For example, the buried insulating layer 192 may include, for example, an oxide layer, a nitride layer, or a combination thereof. In an embodiment of the present inventive concept, the buried insulating layer 192 may include a material the same as that of the insulating layer 132.

A select line cut region SLC may penetrate the uppermost insulating layer 132 of the plurality of insulating layers 132 and the uppermost word line structure WL of the plurality of word line structures WL. For example, the insulating layer 132 in contact with a lower surface of the uppermost word line structure WL may be exposed in the select line cut region SLC. In an embodiment of the present inventive concept, the select line cut region SLC may extend in the second horizontal direction (Y direction). In an embodiment of the present inventive concept, the select line cut region SLC may extend into the next to uppermost insulating layer 132 of the plurality of insulating layers 132 in contact with the lower surface of the uppermost word line structure WL. An isolation insulating layer 194 may fill the select line cut region SLC. For example, the isolation insulating layer 194 may include, for example, an oxide layer, a nitride layer, or a combination thereof. In an embodiment of the present inventive concept, the isolation insulating layer 194 may include a material the same as that of the buried insulating layer 192.

In an embodiment of the present inventive concept, the plurality of word line structures WL may include three word line structures WL apart from each other in the vertical direction (Z direction). The uppermost word line structure WL separated by the select line cut region SLC of the plurality of word line structures WL may include a select line SL. For example, the memory cell structures MCS spaced apart from each other by the select line cut region SLC may be selected separately and controlled through the select line SL cut by the select line cut region SLC. For the two word line structures WL that are not separated by the select line cut region SLC and are separated by the word line cut region WLC, the upper word line structure WL may include a first barrier line UBA, and the lower word line structure WL may include a second barrier line LBA.

A plurality of bit lines BL electrically connected to the drain layers 170 may be arranged on the plurality of insulating layers 132. In an embodiment of the present inventive concept, the plurality of bit lines BL may have a substantially constant distance from each other in the second horizontal direction (Y direction), and may extend in a first horizontal direction (X direction) orthogonal to the second horizontal direction (Y direction). For example, each of the plurality of bit lines BL may extend to contact the drain layers 170 of a row of the plurality of memory cell structures MCS arranged in the second horizontal direction (Y direction). In FIG. 1B, it is illustrated that the plurality of bit lines BL contact the drain layers 170 of the plurality of memory cell structures MCS, but the present inventive concept is not limited thereto. For example, the plurality of bit lines BL may be electrically connected to the drain layers 170 of the plurality of memory cell structures MCS via conductive vias and/or conductive studs.

Referring to FIG. 1D together with FIGS. 1A through 1C, the semiconductor memory device 1 may operate by applying a drain voltage VD to the drain layer 170, a source voltage VS to the common source semiconductor layer 180, a select voltage VG to the select line SL, a first barrier voltage VA to the first barrier line UBA, and a second barrier voltage VB to the second barrier line LBA. The select voltage VG may be provided as a voltage capable of selecting one memory cell structure MCS from the plurality of memory cell structures MCS.

When a relatively large voltage is provided as the first barrier voltage VA to the first barrier line UBA, and a relatively small voltage is provided as the second barrier voltage VB to the second barrier line LBA, a first carrier region 150A may be formed in a portion of the channel layer 150 adjacent to the first barrier line UBA, and a second carrier region 150B may be formed in the other portion of the channel layer 150 adjacent to the second barrier line LBA. In an embodiment of the present inventive concept, the first barrier voltage VA may be a positive voltage that is a forward voltage, and the second barrier voltage VB may be a negative voltage that is a backward voltage. For example, the first barrier voltage VA may be about 5 V, and the second barrier voltage VB may be about −5 V, but these are only examples and the present inventive concept is not limited thereto. Voltage values mentioned in the present inventive concept are only for relative comparison, and are not limited to corresponding values. Alternatively, in an embodiment of the present inventive concept, the first barrier voltage VA may be a negative voltage, and the second barrier voltage VB may be a positive voltage (referring to FIG. 14 to be described). For example, a positive voltage may be provided to one of the first barrier line UBA and the second barrier line LBA, and a negative voltage may be provided to the other thereof.

The drain layer 170 may include a region doped with impurities of the first conductivity type, and the common source semiconductor layer 180 may include a region doped with impurities of the second conductivity type. In an embodiment of the present inventive concept, the first conductivity type may be a p-type and the second conductivity type may be an n-type. For example, the drain layer 170 may be a p+ region, and the common source semiconductor layer 180 may be an n+ region.

When the first barrier voltage VA is applied to the first barrier line UBA, the first carrier region 150A may become a region of the second conductivity type where there are electrons as a plurality of carriers, and when the second barrier voltage VB is applied to the second barrier line LBA, the second carrier region 150B may become a region of the first conductivity type where there are holes as a plurality of carriers. For example, the first carrier region 150A to which the first barrier voltage VA is provided may include an n+ region, and the second carrier region 150B to which the second barrier voltage VB is provided may include a p+ region.

The drain layer 170, the first carrier region 150A, and the second carrier region 150B may constitute a pnp transistor, and the first carrier region 150A, the second carrier region 150B, and the common source semiconductor layer 180 may constitute an npn transistor, and thus, the memory cell structure MCS may form a thyristor of a pnpn structure. For example, the memory cell structure MCS may include alternating p-type and n-type semiconductors (p-n-p-n), and may have three junctions: pn, np, and pn. For example, the memory cell structure MCS may include two transistors, for example, the pnp transistor and the npn transistor, coupled together.

When a difference between the drain voltage VD and the source voltage VS is provided to the drain layer 170 and the common source semiconductor layer 180 by sweeping from about 0 V to a voltage equal to or greater than a trigger voltage, a thyristor operation may be performed in the memory cell structure MCS, and a high current state with high drain current may be maintained for a certain period of time. On the other hand, when the difference between the drain voltage VD and the source voltage VS is applied to the drain layer 170 and the common source semiconductor layer 180 as a voltage less than the trigger voltage, a low current state in which little current flows may be maintained for a certain period of time due to a potential barrier in the memory cell structure MCS. In an embodiment of the present inventive concept, the trigger voltage may be about 3 V.

When the difference between the drain voltage VD and the source voltage VS is provided to the drain layer 170 and the common source semiconductor layer 180 as a read voltage of about ½ of the trigger voltage, two current states of a high current state and a low current state, that is, stored data of 1 bit may be read.

The semiconductor memory device 1 may constantly provide the first barrier voltage VA to the first barrier line UBA, and the second barrier voltage VB to the second barrier line LBA so that the memory cell structure MCS has the thyristor of the pnpn structure, may select one memory cell structure MCS of the plurality of memory cell structures MCS by providing the select voltage VG to the source line SL, and may function as a volatile memory device such as DRAM capable of performing a write operation and a read operation by providing the trigger voltage and the read voltage by controlling the drain voltage VD and the source voltage VS, respectively. In other words, each of the plurality of memory cell structures MCS may include a volatile memory device having a thyristor structure.

The memory cell dielectric layer MCD, that is the stacked insulating structure 140, including the gate insulating layer 142 and the charge trap layer 144 may be arranged between the first barrier line UBA and the channel layer 150, and between the second barrier line LBA and the channel layer 150. Accordingly, when the first carrier region 150A and the second carrier region 150B are formed by proving the first barrier voltage VA to the first barrier line UBA and the second barrier voltage VB to the second barrier line LBA, a plurality of carriers in the first carrier region 150A and the second carrier region 150B may be trapped in each of a portion of the charge trap layer 144 adjacent to the first carrier region 150A, and a portion of the charge trap layer 144 adjacent to the second carrier region 150B. For example, electrons as carriers of the first carrier region 150A, which may become a region of the second conductivity type, may be trapped in a portion of the charge trap layer 144 between the first barrier line UBA and the first carrier region 150A of the channel layer 150. For example, holes as carriers of the second carrier region 150B, which may become a region of the first conductivity type, may be trapped in a portion of the charge trap layer 144 between the second barrier line LBA and the second carrier region 150B of the channel layer 150. Accordingly, two current states storing data in the memory cell structure MCS by using the plurality of carriers trapped in the charge trap layer 144 may be maintained for a relatively longer time. In addition, a current difference between the high current state and the low current state may be increased due to the plurality of carriers trapped in the charge trap layer 144.

The semiconductor memory device 1 according to the present inventive concept may allow each of the plurality of memory cell structures (MCS) to have the thyristor of the pnpn structure, and thus, may function as a DRAM capable of performing the write operation, for example, by providing a trigger voltage, and the read operation, for example, by providing about ½ of the trigger voltage on two current states of the high current state and the low current state, that is, on the stored data of 1 bit for each of the plurality of memory cell structures (MCS), respectively, and carriers may be trapped in the charge trap layer 144 in contact with the channel layer 150, and accordingly, retention time and memory window characteristics may be enhanced.

FIGS. 2A through 2C, 3A through 3C, 4A through 4C, 5A through 5C, 6A and 6B, 7A through 7C, 8, 9, 10, 11A through 11C, 12A through 12C, and 13A through 13C are top views and cross-sectional views sequentially illustrating a manufacturing method of a semiconductor memory device, according to an embodiment of the present inventive concept. FIGS. 2A, 3A, 4A, 5A, 6A, 7A, 11A, 12A, and 13A are top views sequentially illustrating a manufacturing method of a semiconductor memory device, according to an embodiment of the present inventive concept, FIGS. 2B, 3B, 4B, 5B, 6B, 7B, 8, 9, 10, 11B, 12B, and 13B are cross-sectional views taken along line B-B' in 2A, 3A, 4A, 5A, 6A, 7A, 11A, 12A, and 13A, respectively, and FIGS. 2C, 3C, 4C, 5C, 7C, 11C, 12C and 13C are cross-sectional views taken along line C-C' in FIGS. 2B, 3B, 4B, 5B, 7B, 11B, 12B, and 13B, respectively.

Figure 2A:
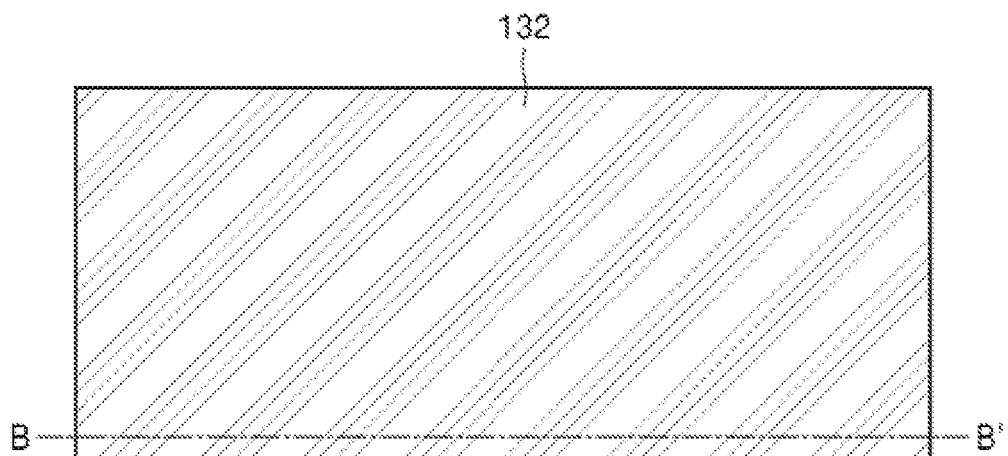
FIGS. 2A through 2C, 3A through 3C, 4A through 4C, 5A through 5C, 6A and 6B, 7A through 7C, 8, 9, 10, 11A through 11C, 12A through 12C, and 13A through 13C are top views and cross-sectional views sequentially illustrating a manufacturing method of a semiconductor memory device, according to an embodiment of the present inventive concept.
Figure 2B:
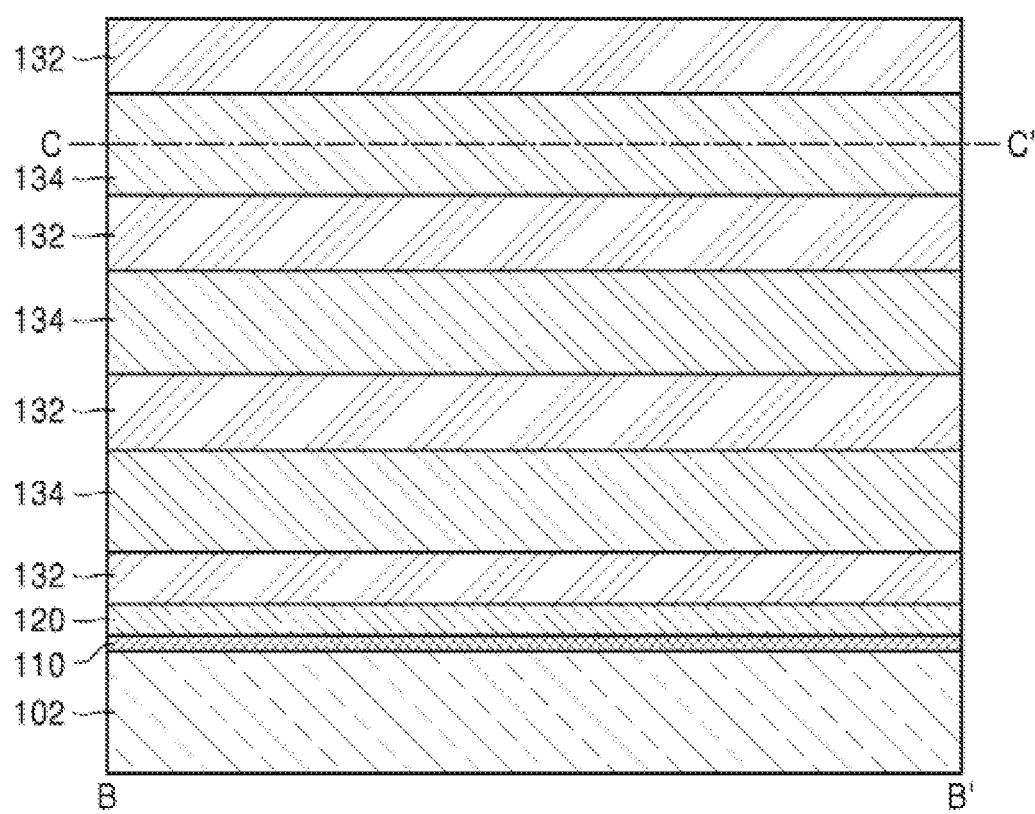
Figure 2C:
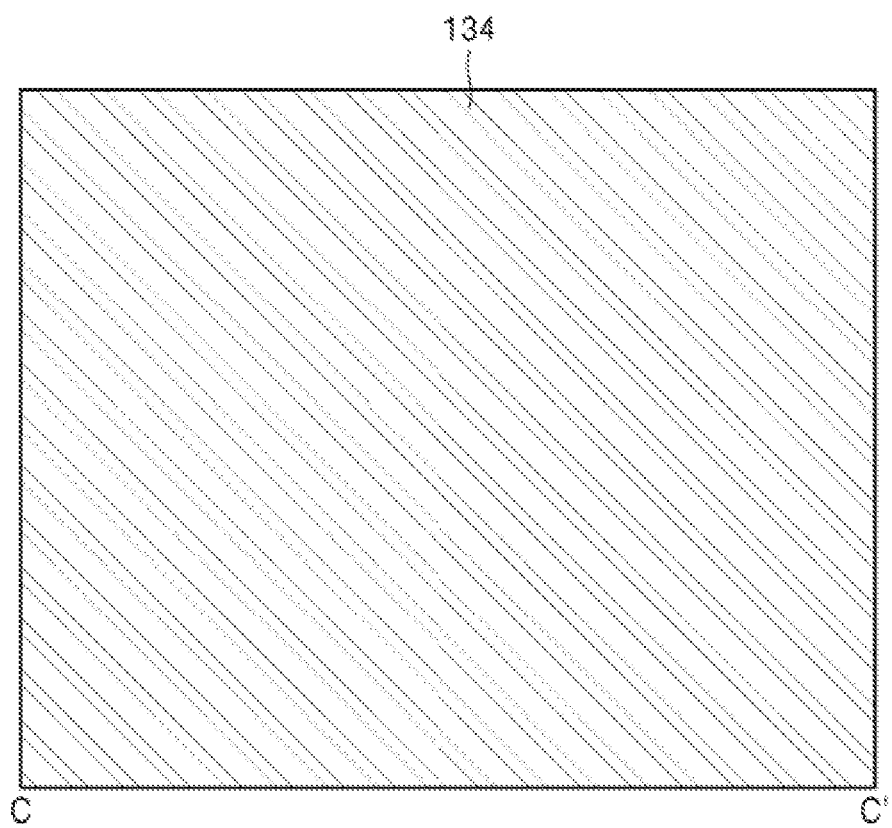

Referring to FIGS. 2A through 2C, a sacrificial semiconductor layer 120 may be formed on the semiconductor substrate 102, and the plurality of insulating layers 132 and a plurality of sacrificial layers 134 may be alternately stacked on the sacrificial semiconductor layer 120. In an embodiment of the present inventive concept, the plurality of insulating layers 132 may be formed with one more layer than the plurality of sacrificial layers 134, and thus, the sacrificial layers 134 may be arranged between the plurality of insulating layers 132 apart from each other in the vertical direction (Z direction). For example, the insulating layer 132 may be arranged under the lowermost sacrificial layer 134 of the plurality of sacrificial layers 134 and on the uppermost sacrificial layer 134.

In an embodiment of the present inventive concept, before the sacrificial semiconductor layer 120 is formed, the etch stop layer 110 may be formed on the semiconductor substrate 102, and then the sacrificial semiconductor layer 120 may be formed on the etch stop layer 110.

The semiconductor substrate 102 may include, for example, silicon (Si), for example, crystalline silicon (c-Si), polycrystalline silicon (p-Si), or amorphous silicon (a-Si). Alternatively, the semiconductor substrate 102 may include a semiconductor element such as germanium (Ge), or at least one compound semiconductor of, for example, silicon germanium (SiGe), silicon carbide (SiC), gallium arsenide (GaAs), indium arsenide (InAs), indium antimonide (InSb), lead tellurium (PbTe) compounds, gallium antimonide (GaSb), indium phosphide (InP), or indium gallium arsenide (InGaAs). Alternatively, the semiconductor substrate 102 may include a silicon-on-insulator (SOI) substrate, a silicon germanium-on-insulator (SGOI) substrate, or a germanium-on-insulator (GOI) substrate. For example, the semiconductor substrate 102 may include the BOX layer. The semiconductor substrate 102 may include a conductive region, for example, a well doped with an impurity, or a structure doped with an impurity. In addition, the substrate 10 may include one or more semiconductor layers or structures and may include active or operable portions of semiconductor devices.

In an embodiment of the present inventive concept, a device isolation layer may be formed on the semiconductor substrate 102. The device isolation layer may include at least one of, for example, a silicon oxide ($SiO_2$) layer, a silicon nitride ($Si_3N_4$) layer, or a silicon oxynitride (SiON) layer. The device isolation layer may include a single layer including one kind of an insulating layer, a double layer including two kinds of insulating layers, or a multiple layer including a combination of at least three kinds of insulating layers. For example, the device isolation layer may include two different kinds of insulating layers such as, for example, a silicon oxide ($SiO_2$) layer and a silicon nitride ($Si_3N_4$) layer. For example, the device isolation layer may include a triple layer including a silicon oxide ($SiO_2$) layer, a silicon nitride ($Si_3N_4$) layer, and a silicon oxide ($SiO_2$) layer. The device isolation layer may include the STI structure. In an embodiment of the present inventive concept, a device isolation trench may be formed by removing an upper portion of the semiconductor substrate 102 through an anisotropic etching process, and then an insulating film including, for example, silicon oxide ($SiO_2$), silicon nitride ($Si_3N_4$), and/or silicon oxynitride (SiON) may be provided to fill the device isolation trench.

The etch stop layer 110 may include a material having an etch selectivity with respect to each of the semiconductor substrate 102, the sacrificial semiconductor layer 120, the insulating layer 132, and the sacrificial layer 134. For example, each of the semiconductor substrate 102, the sacrificial semiconductor layer 120, the insulating layer 132, and the sacrificial layer 134 may be selectively etched away rapidly while the etch stop layer 110 may be etched very slowly or not etched at all. In an embodiment of the present inventive concept, the semiconductor substrate 102 may include silicon (Si), the sacrificial semiconductor layer 120 may include polysilicon (p-Si), the insulating layer 132 may include oxide, and when the sacrificial layer 134 includes nitride, the etch stop layer 110 may include oxynitride. For example, the etch stop layer 110 may include silicon oxynitride (SiON).

The sacrificial semiconductor layer 120 may include a material having an etch selectivity with respect to each of the etch stop layer 110, the insulating layer 132, and the sacrificial layer 134. For example, the sacrificial semiconductor layer 120 may be selectively etched away rapidly while each of the etch stop layer 110, the insulating layer 132, and the sacrificial layer 134 may be etched very slowly or not etched at all. The sacrificial semiconductor layer 120 may be formed by performing a deposition process. In an embodiment of the present inventive concept, the sacrificial semiconductor layer 120 may include polysilicon (p-Si).

The insulating layer 132 and the sacrificial layer 134 may include materials of different etching selectivity's from each other. The insulating layer 132 and the sacrificial layer 134 may be formed by performing, for example, a chemical vapor deposition (CVD) process, an atomic layer deposition (ALD) process, a physical vapor deposition (PVD) process, or the like. In an embodiment of the present inventive concept, the insulating layer 132 may include, for example, silicon oxide ($SiO_2$), and the sacrificial layer 134 may include, for example, silicon nitride ($Si_3N_4$).

Figure 3A:
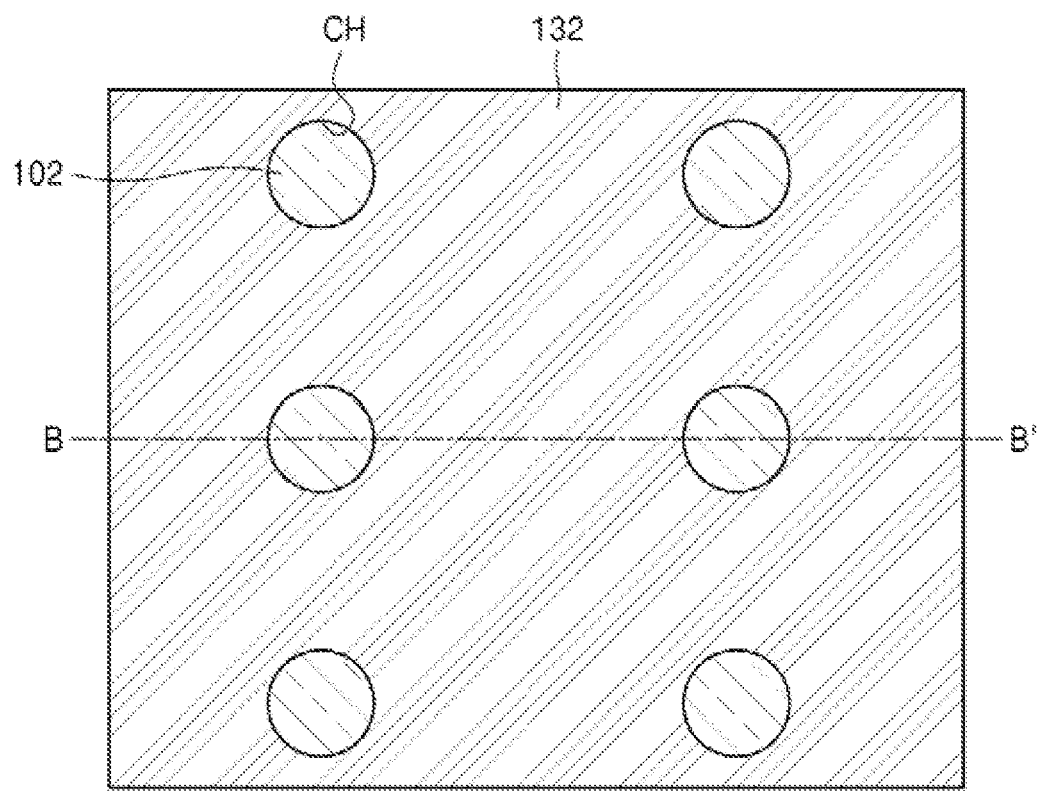
Figure 3B:
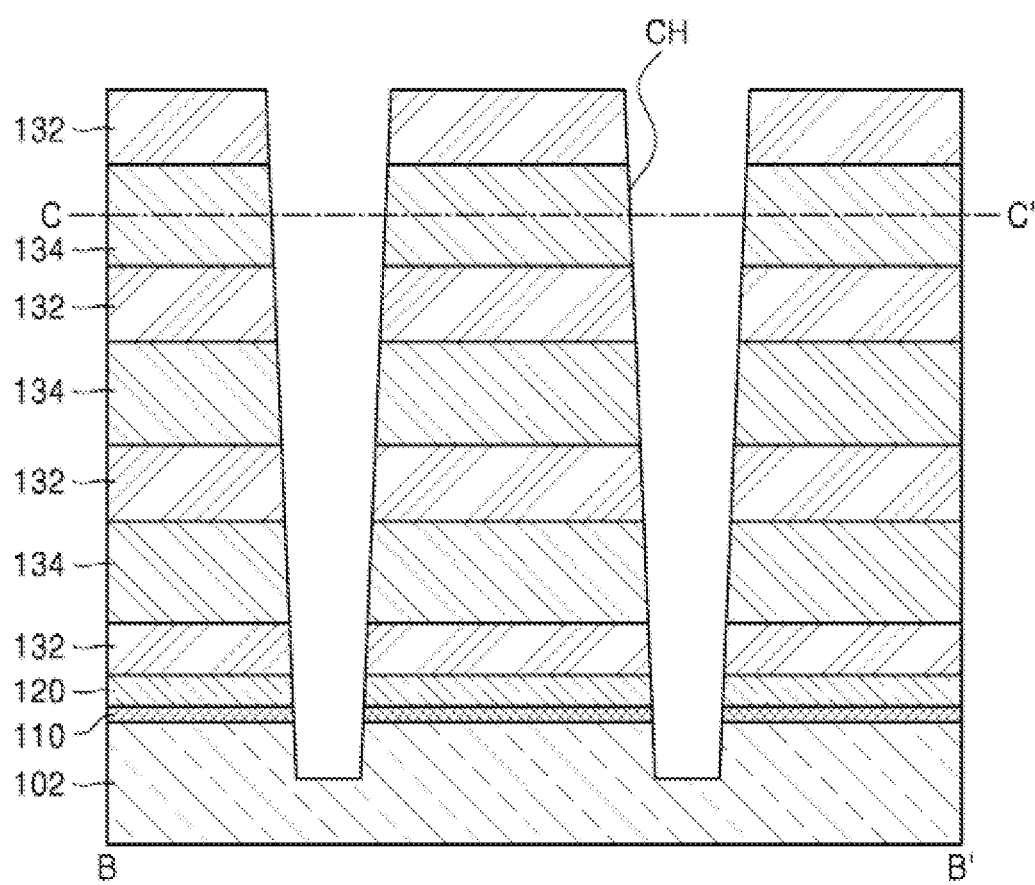
Figure 3C:
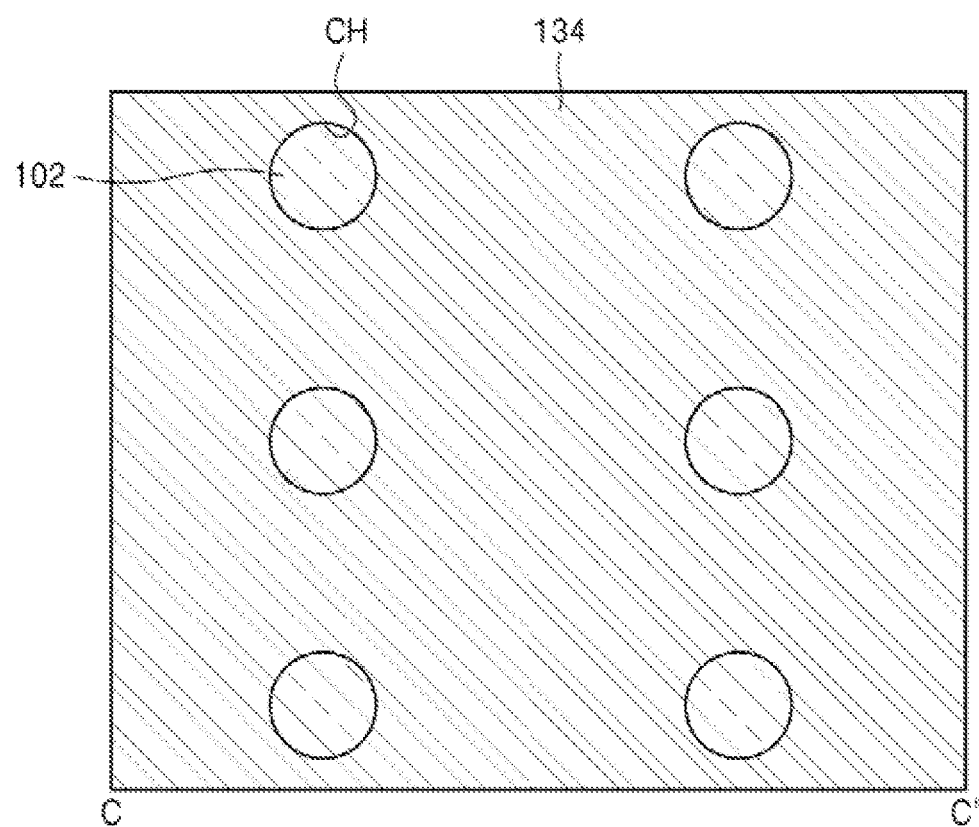

Referring to FIGS. 3A through 3C together, the plurality of channel holes CH penetrating the plurality of insulating layers 132, the plurality of sacrificial layers 134, and the sacrificial semiconductor layer 120, and extending into the semiconductor substrate 102 may be formed. The semiconductor substrate 102 may be exposed to the bottom of the plurality of channel holes CH. In an embodiment of the present inventive concept, when the etch stop layer 110 is placed between the semiconductor substrate 102 and the sacrificial semiconductor layer 120, the plurality of channel holes CH may penetrate the plurality of insulating layers 132, the plurality of sacrificial layer 134, the etch stop layer 110, and the sacrificial semiconductor layer 120, and may extend into the semiconductor substrate 102. In an embodiment of the present inventive concept, the plurality of channel holes CH may be formed by performing an anisotropic etching process. For example, the anisotropic etching process may be a reactive ion etching (RIE) process.

In FIGS. 3A and 3C, it is illustrated that the plurality of channel holes CH have a matrix arrangement in which columns are formed in each of the first horizontal direction (X direction) and the second horizontal direction (Y direction), but the present inventive concept is not limited thereto. In an embodiment of the present inventive concept, the plurality of channel holes CH may be arranged in a row in the first horizontal direction (X direction), and may be arranged in a zigzag pattern in the second horizontal direction (Y direction). For example, the plurality of channel holes CH may be arranged in a honeycomb form.

In an embodiment of the present inventive concept, a width of each of the plurality of channel holes CH in the first or second horizontal direction (X direction or Y direction) may become less toward the semiconductor substrate 102 in a tapered shape. This may be due to the characteristics of the etching process for forming the channel holes CH. In an embodiment of the present inventive concept, the width of each of the plurality of channel holes CH in the first or second horizontal direction (X direction or Y direction) may have the maximum width on the lower side rather than on the uppermost end of each of the channel holes CH, and may become smaller from a portion of the maximum width toward the semiconductor substrate 102, due to a bowing phenomenon generated in a process of anisotropic etching of the plurality of insulating layers 132, the plurality of sacrificial layers 134, the sacrificial semiconductor layer 120, and the etch stop layer 110.

Figure 4A:
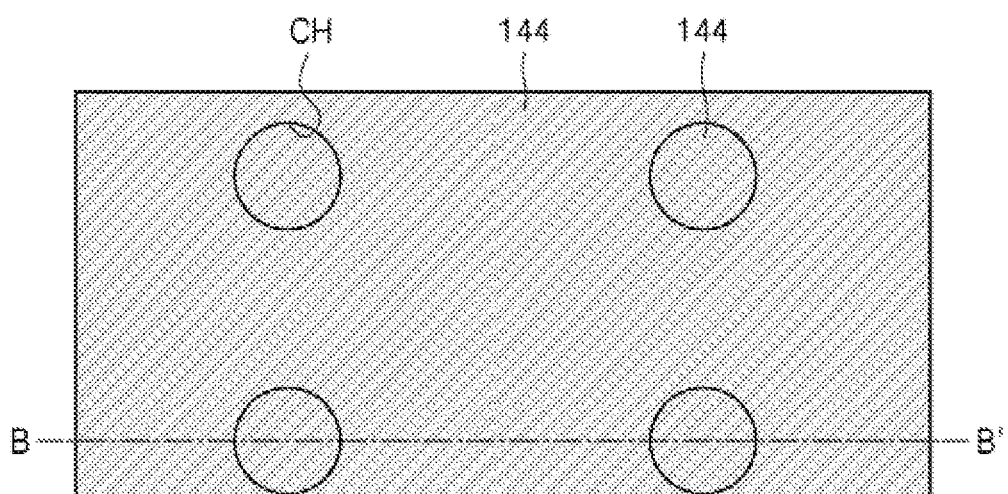
Figure 4B:
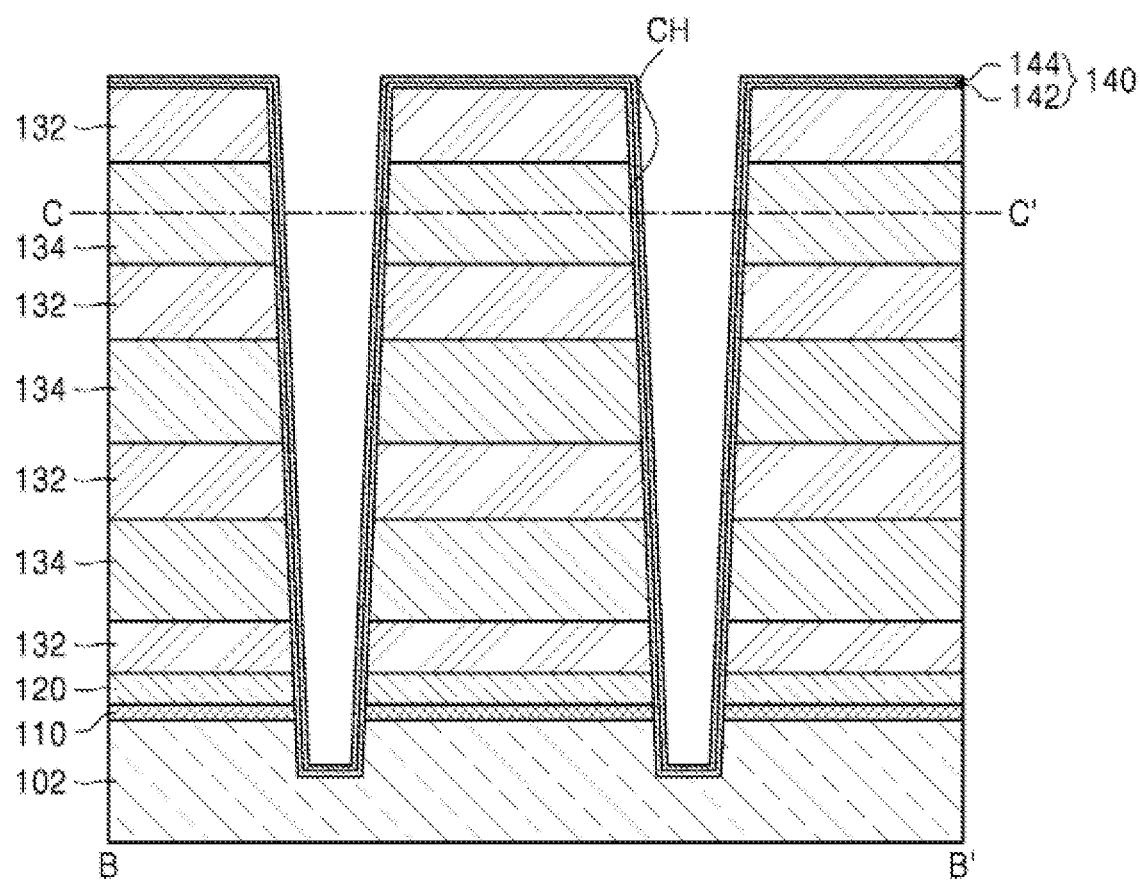
Figure 4C:
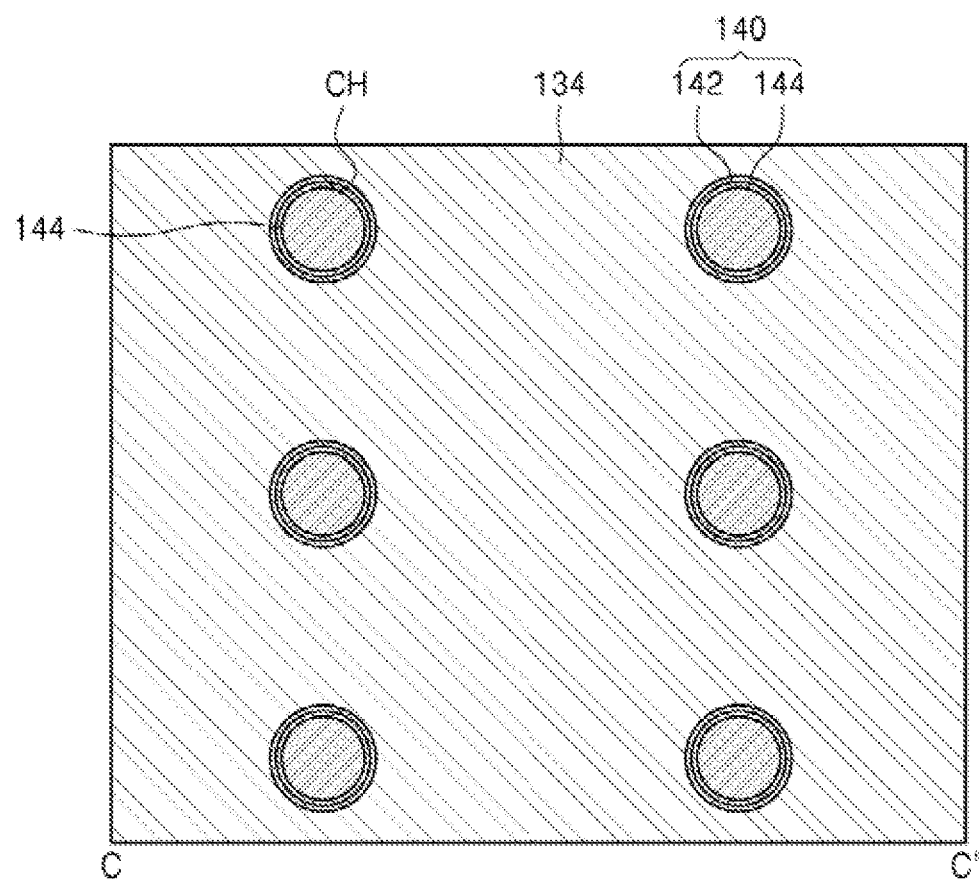

Referring to FIGS. 4A through 4C together, the stacked insulating structure 140 covering the internal wall and the bottom surface of each of the plurality of channel holes CH may be formed. The stacked insulating structure 140 may include the gate insulating layer 142 covering the internal wall and the bottom surfaces of each of the plurality of channel holes CH, and a charge trap layer 144 covering the gate insulating layer 142. The gate insulating layer 142 may have a substantially constant thickness and conformally cover the internal wall and the bottom of the channel hole CH, and the charge trap layer 144 may have a substantially constant thickness and conformally cover the gate insulating layer 142. The gate insulating layer 142 and the charge trap layer 144 may be conformally formed to have thicknesses that do not fill each of the channel holes CH. The gate insulating layer 142 and the charge trap layer 144 may be formed by performing, for example, an ALD process. In an embodiment of the present inventive concept, the stacked insulating structure 140 including the gate insulating layer 142 and the charge trap layer 144 may further cover an upper surface of a stacked structure of the plurality of insulating layers 132 and the plurality of sacrificial layers 134, for example, an uppermost surface of the uppermost insulating layer 132.

The gate insulating layer 142 may include a material of a relatively low trap site density, and the charge trap layer 144 may include a material of a relatively high trap site density. For example, the charge trap layer 144 may include a material having trap site density and permittivity higher than those of a material included in the gate insulating layer 142. For example, the gate insulating layer 142 may include silicon oxide ($SiO_2$). In an embodiment of the present inventive concept, the charge trap layer 144 may include a high-k material having a dielectric constant higher than that of the gate insulating layer 142. For example, the charge trap layer 144 may include at least one of, for example, silicon nitride ($Si_3N_4$), hafnium oxide ($HfO_2$), aluminum oxide ($Al_2O_3$), zirconium oxide ($ZrO_2$), yttrium oxide ($Y_2O_3$), lanthanum oxide ($La_2O_3$), lanthanum aluminum oxide ($LaAlO_3$), hafnium silicon oxynitride (HfSiON), hafnium oxynitride (HfON), or hafnium aluminum oxide ($HfAlO_3$). In an embodiment of the present inventive concept, the charge trap layer 144 may include a dielectric layer doped with transition metal atoms. For example, the charge trap layer 144 may include hafnium oxide ($HfO_2$) doped with transition metal atoms such as, for example, tantalum (Ta), vanadium (V), ruthenium (Ru), niobium (Nb), manganese (Mn), palladium (Pd), iridium (Ir), and antimony (Sb), or aluminum oxide ($Al_2O_3$) doped with transition metal atoms such as zinc (Zn), tungsten (W), molybdenum (Mo), ruthenium (Ru), hafnium (Hf), nickel (Ni), and platinum (Pt), or with silicon (Si).

Figure 5A:
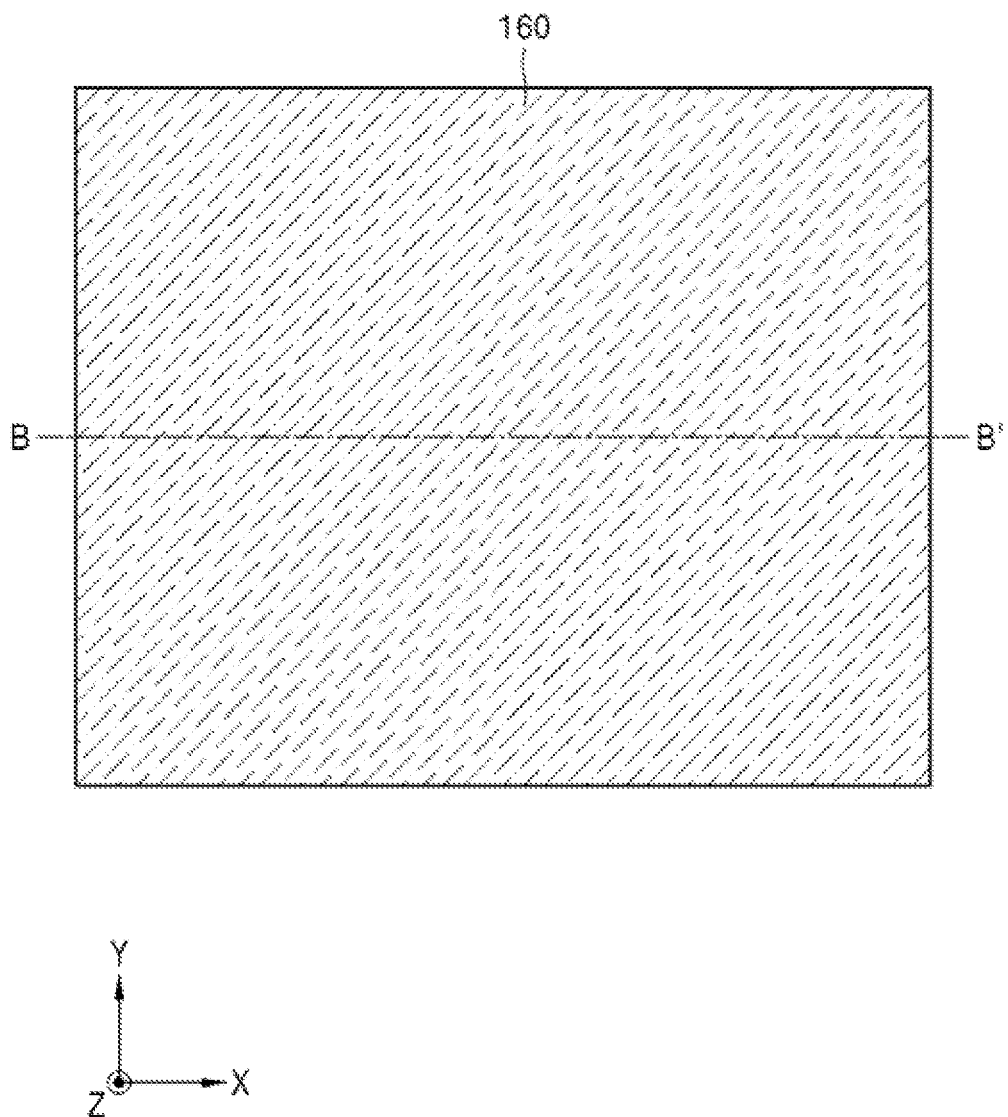
Figure 5B:
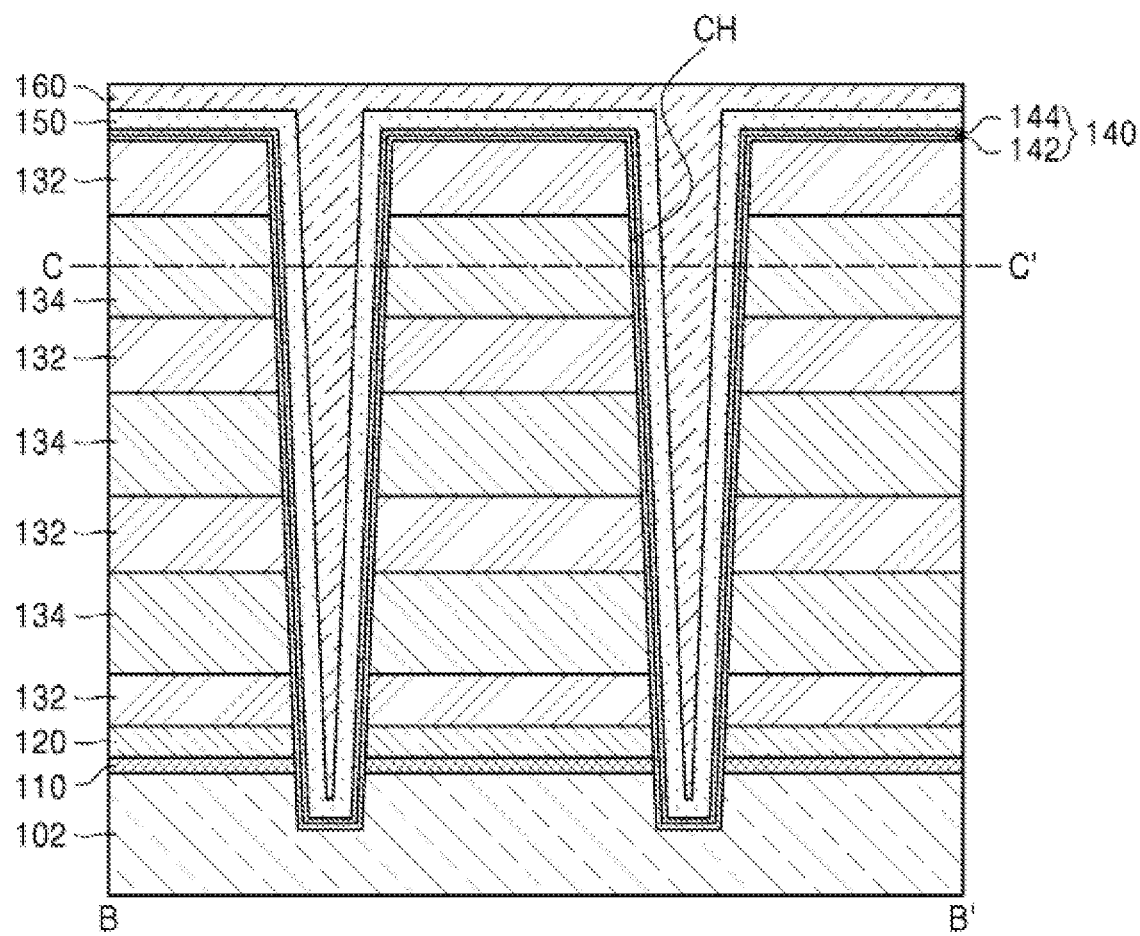
Figure 5C:
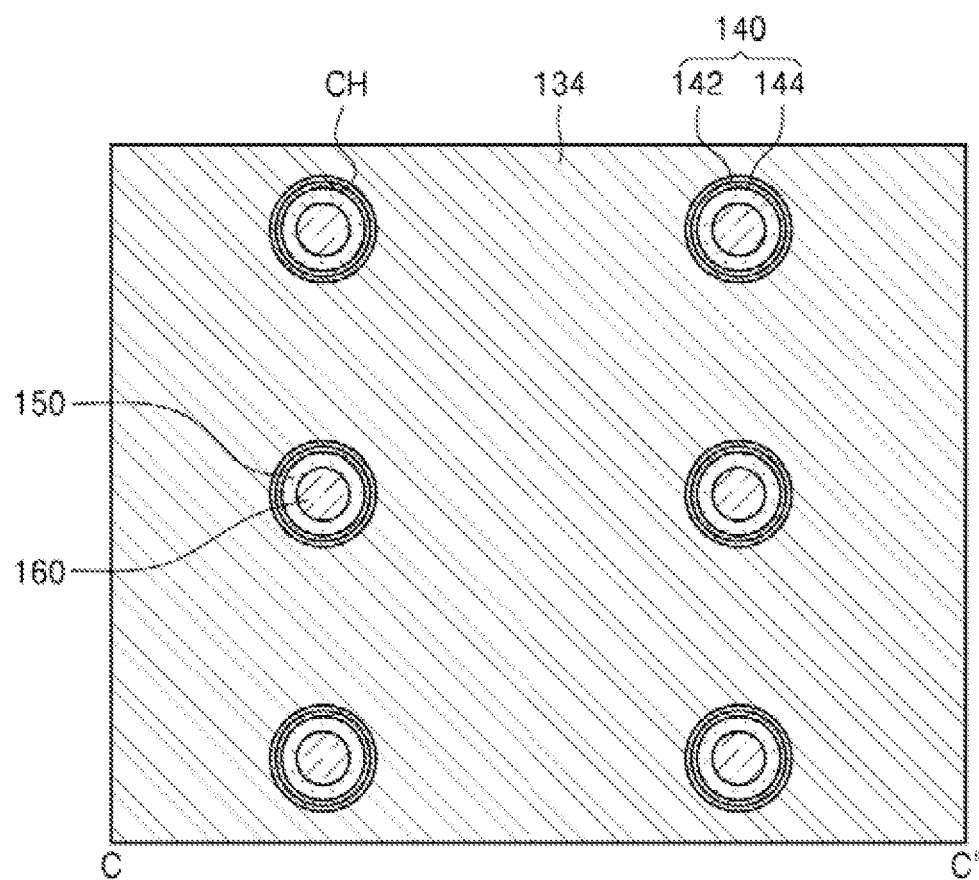

Referring to FIGS. 5A through 5C, the channel layer 150 filling at least a portion of the channel hole CH may be formed on the stacked insulating structure 140. In an embodiment of the present inventive concept, the channel layer 150 may conformally cover the charge trap layer 144 of the stacked insulating structure 140 and fill a portion of the channel hole CH, and the filling insulating layer 160 filling all the remaining portions of the channel hole CH may be formed on the channel layer 150. The channel layer 150 formed on the stacked insulating structure 140 may have a circular tube shape. Thus, the filling insulating layer 160 may be surrounded by the channel layer 150. For example, the filling insulating layer 160 may include an insulating material. In an embodiment of the present inventive concept, the filling insulating layer 160 may include silicon oxide ($SiO_2$). In an embodiment of the present inventive concept, the channel layer 150 may be formed on the charge trap layer 144 of the stacked insulating structure 140 to fill the whole channel hole CH, and in this case, the filling insulating layer 160 may not be formed. For example, the channel layer 150 formed on the stacked insulating structure 140 may have a solid pillar shape.

In an embodiment of the present inventive concept, the channel layer 150 may include intrinsic polysilicon (p-Si) not doped with impurities. In an embodiment of the present inventive concept, the channel layer 150 may include polysilicon (p-Si) of a relatively low doping concentration of p0.

Figure 6A:
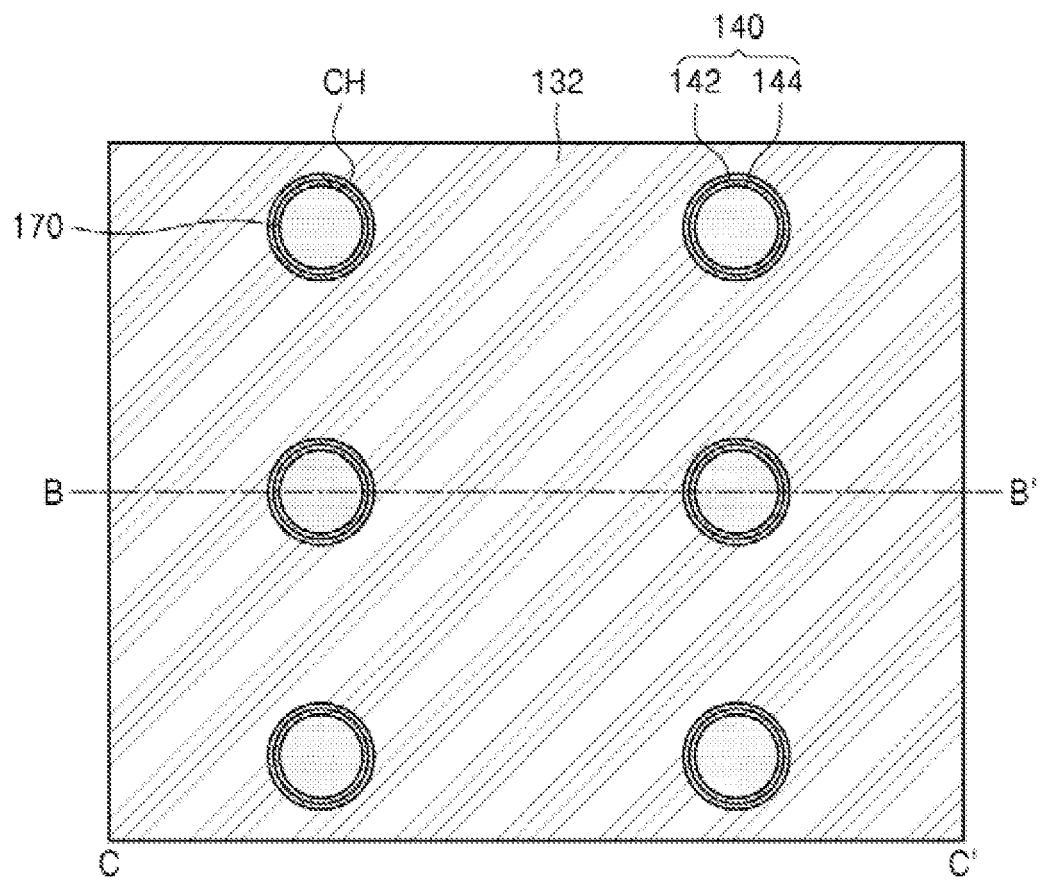
Figure 6B:
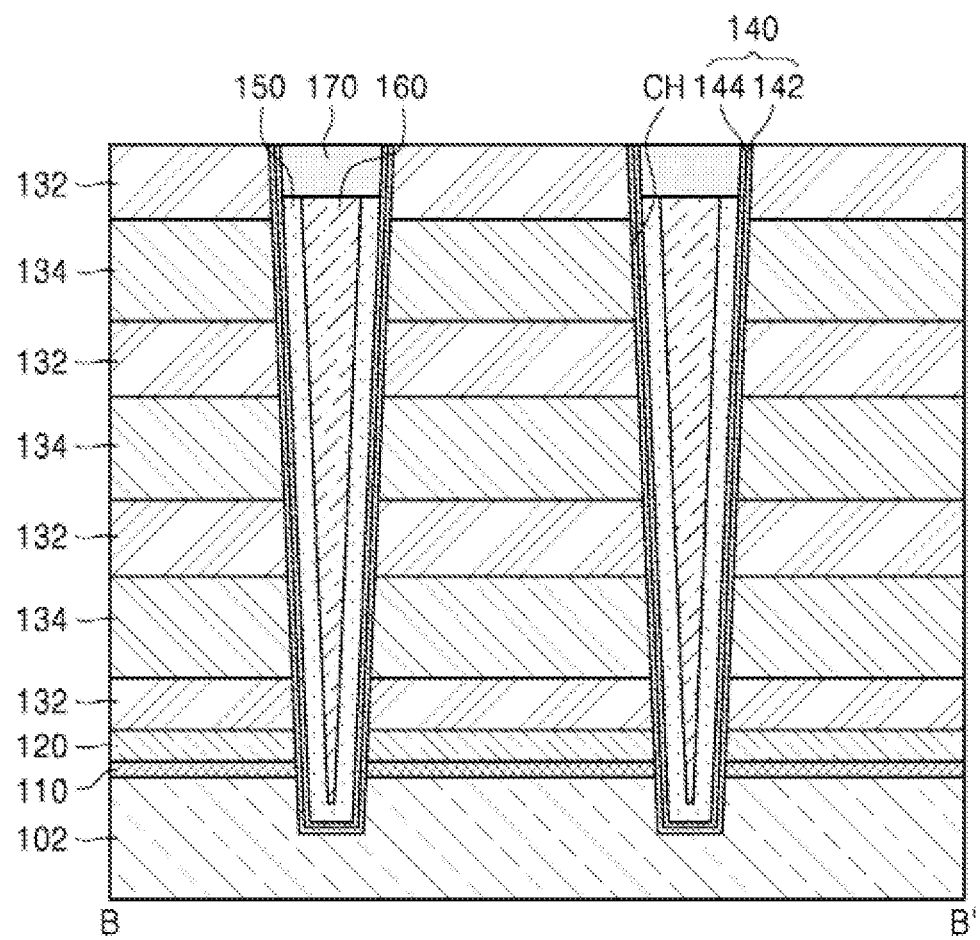

Referring to FIGS. 6A through 6C, a portion of the channel layer 150 and a portion of the filling insulating layer 160 positioned at a vertical level higher than the upper surface of the stacked structure of the plurality of insulating layers 132 and the plurality of sacrificial layers 134 may be removed, and a portion of the channel layer 150 and a portion of the filling insulating layer 160 filling the upper portion of the plurality of channel holes CH may be further removed. By removing a portion of the channel layer 150 and a portion of the filling insulating layer 160, the upper surface of the channel layer 150 and the upper surface of the filling insulating layer 160 may have a vertical level lower than the upper surface of the stacked structure of the plurality of insulating layers 132 and the plurality of sacrificial layers 134, respectively. In an embodiment of the present inventive concept, after the removing process, the upper surface of the channel layer 150 and the upper surface of the filling insulating layer 160 may have a vertical level higher than the lower surface of the uppermost insulating layer 132 of the plurality of insulating layers 132.

Thereafter, the drain layer 170 filling the upper portion of each of the plurality of channel holes CH in which the portion of the channel layer 150 and the portion of the filling insulating layer 160 have been removed may be formed. The drain layer 170 may include a semiconductor material doped with impurities of the first conductivity type. In an embodiment of the present inventive concept, the first conductivity type may be a p-type. For example, the drain layer 170 may include p+ polysilicon (p-Si) doped with p-type impurities (e.g., boron (B), aluminum (Al), gallium (Ga), etc.) at a high concentration.

Referring to FIGS. 6A through 7C, the word line cut region WLC penetrating the plurality of insulating layers 132 and the plurality of sacrificial layers 134 may be formed. The word line cut region WLC may be formed by performing an anisotropic etching to remove a portion of each of the plurality of insulating layers 132, the plurality of sacrificial layers 134, and the sacrificial semiconductor layer 120 so that the sacrificial semiconductor layer 120 is exposed. In an embodiment of the present inventive concept, the word line cut region WLC may penetrate the plurality of insulating layers 132, the plurality of sacrificial layers 134, and the sacrificial semiconductor layer 120 so that the etch stop layer 110 is exposed to lower surface of the word line cut region WLC. In an embodiment of the present inventive concept, the word line cut region WLC may extend in the second horizontal direction (Y direction). For example, the word line cut region WLC may extend in a direction intersecting the plurality of bit lines BL which may extend in the first horizontal direction (X direction).

In an embodiment of the present inventive concept, the width of the word line cut region WLC in the first horizontal direction (X direction) may have a tapered shape that becomes smaller toward the semiconductor substrate 102. This may be due to the characteristics of the etching process for forming the word line cut region WLC.

Figure 7A:
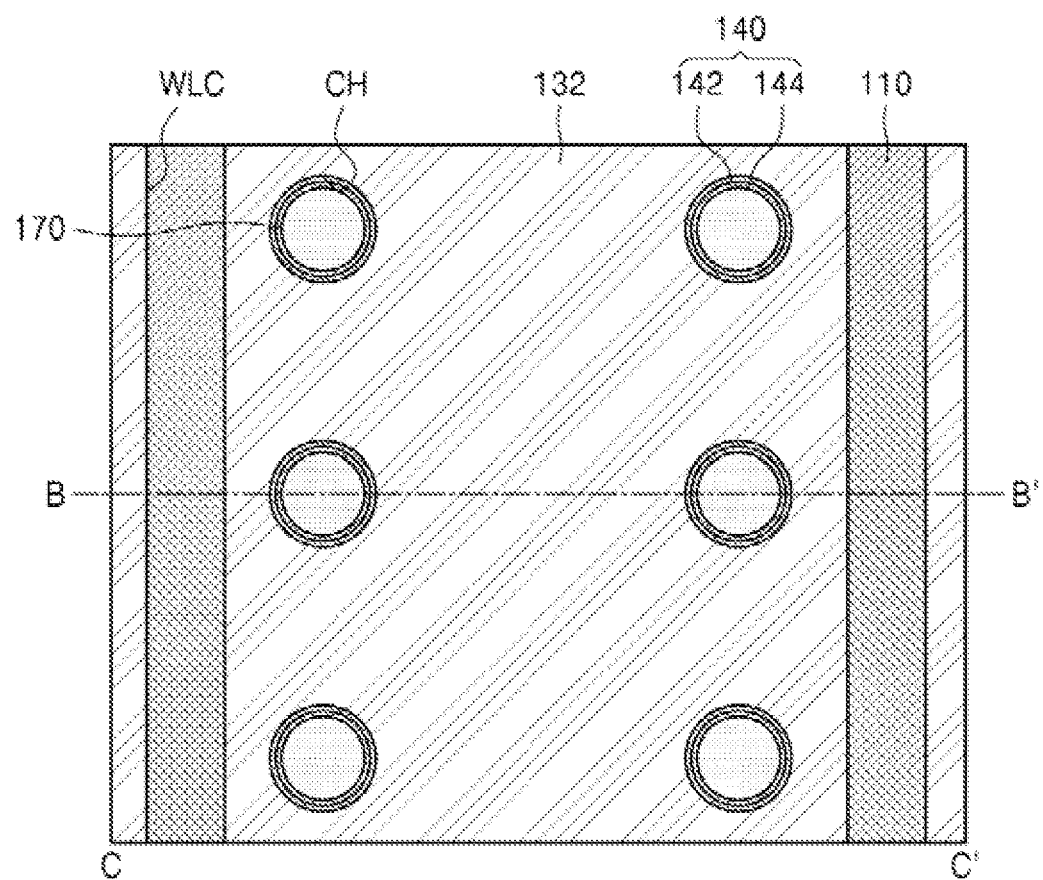
Figure 7B:
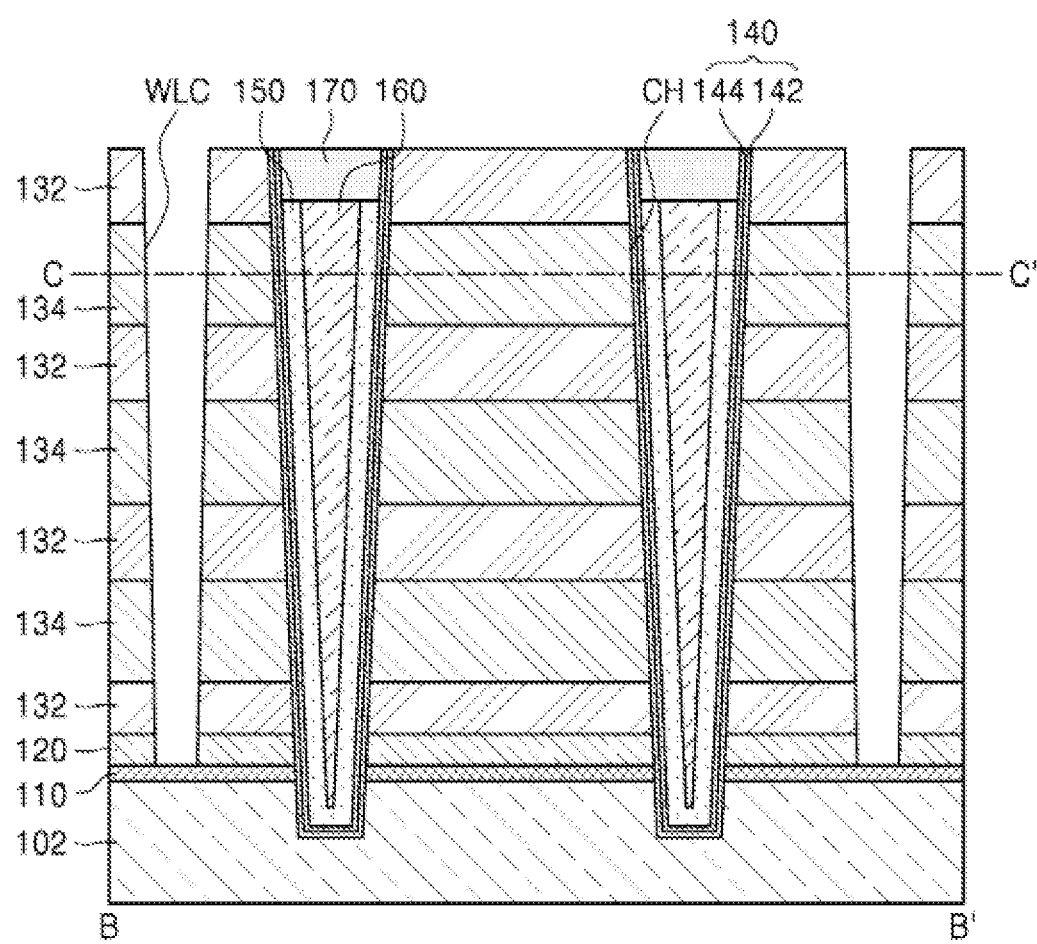
Figure 7C:
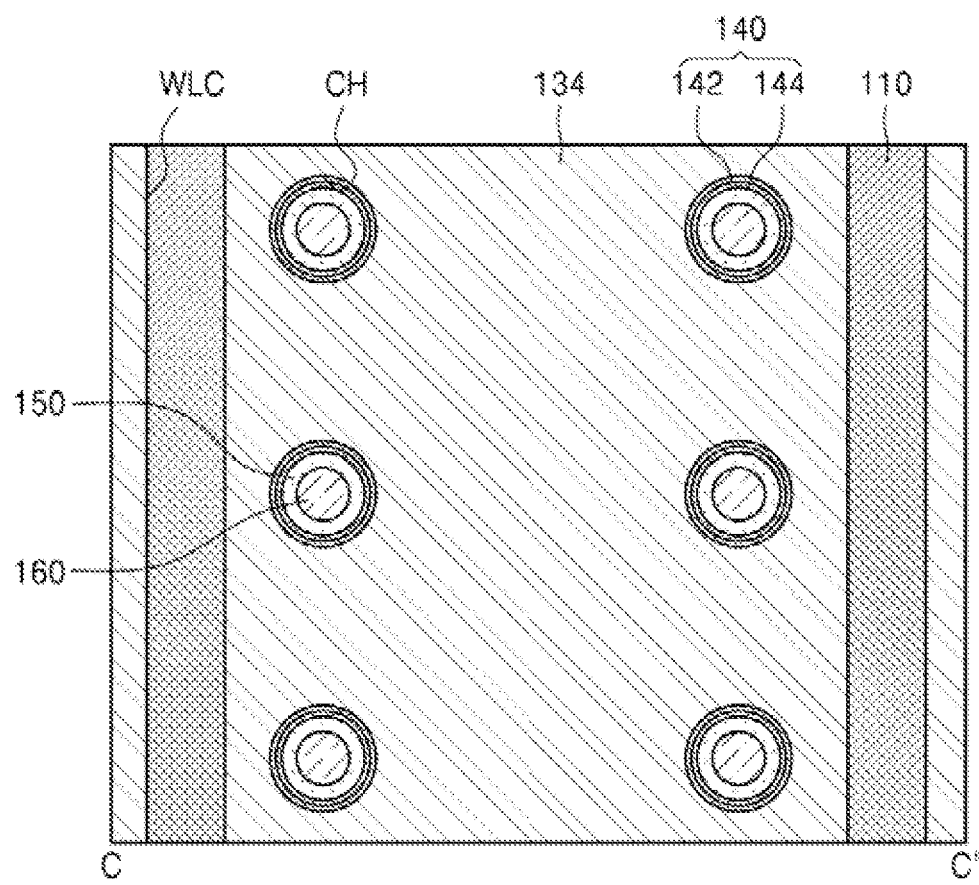
Figure 8:
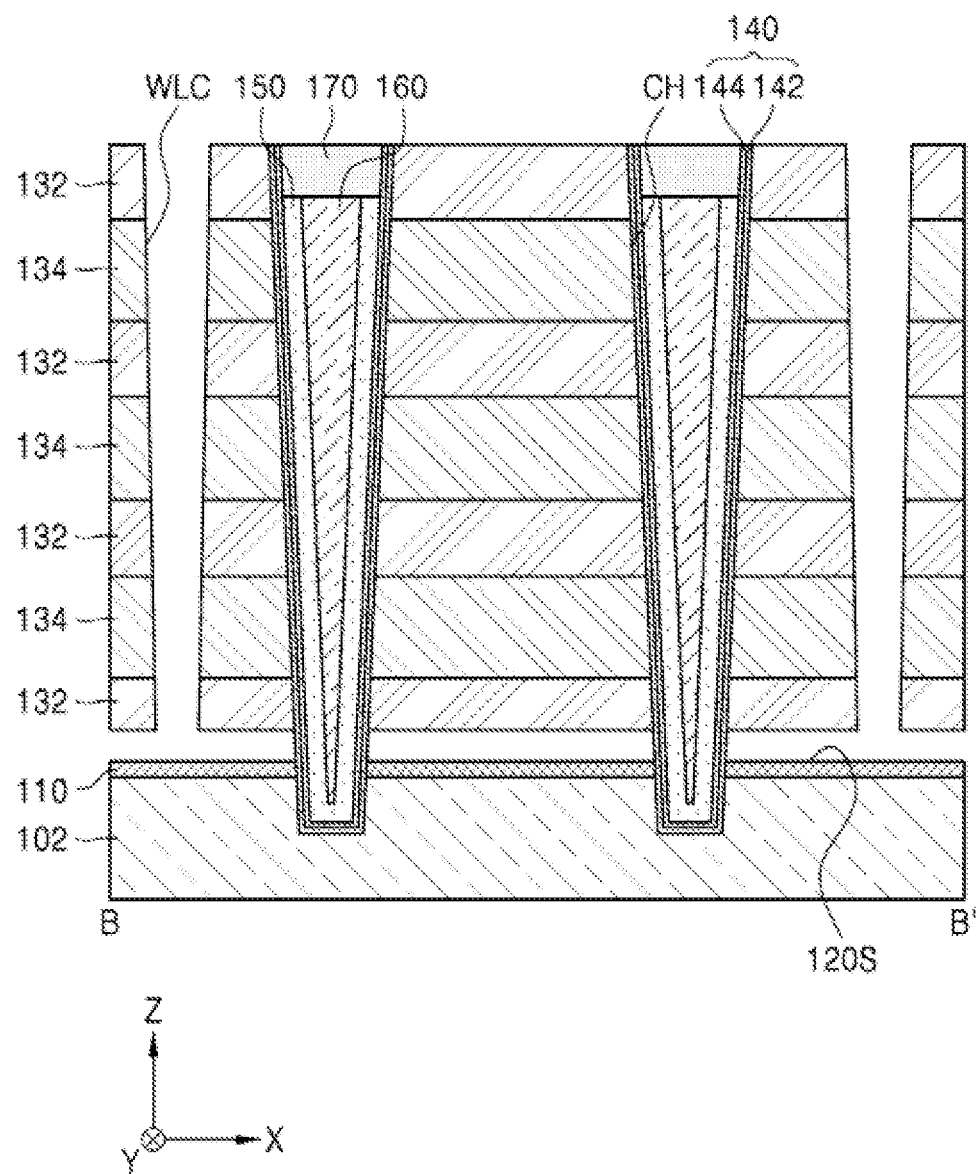

Referring to FIGS. 7A through 8 together, the sacrificial semiconductor layer 120 may be removed via the word line cut region WLC. For example, the sacrificial semiconductor layer 120 may be removed by performing an isotropic etching process using an etchant supplied via the word line cut region WLC. For example, the sacrificial semiconductor layer 120 may be selectively removed with respect to the plurality of insulating layers 132, the plurality of sacrificial layers 134, and the etch stop layer 110 using a wet etching process which is an isotropic etching process. Alternatively, an isotropic dry etching process may be used to selectively remove the sacrificial semiconductor layer 120. An internal space 120S may be formed in a portion where the sacrificial semiconductor layer 120 has been removed. The internal space 120S may be a space between the etch stop layer 110 and the lowermost insulating layer 132 of the plurality of insulating layers 132. The word line cut region WLC and the internal space 120S may be interconnected to each other.

Figure 9:
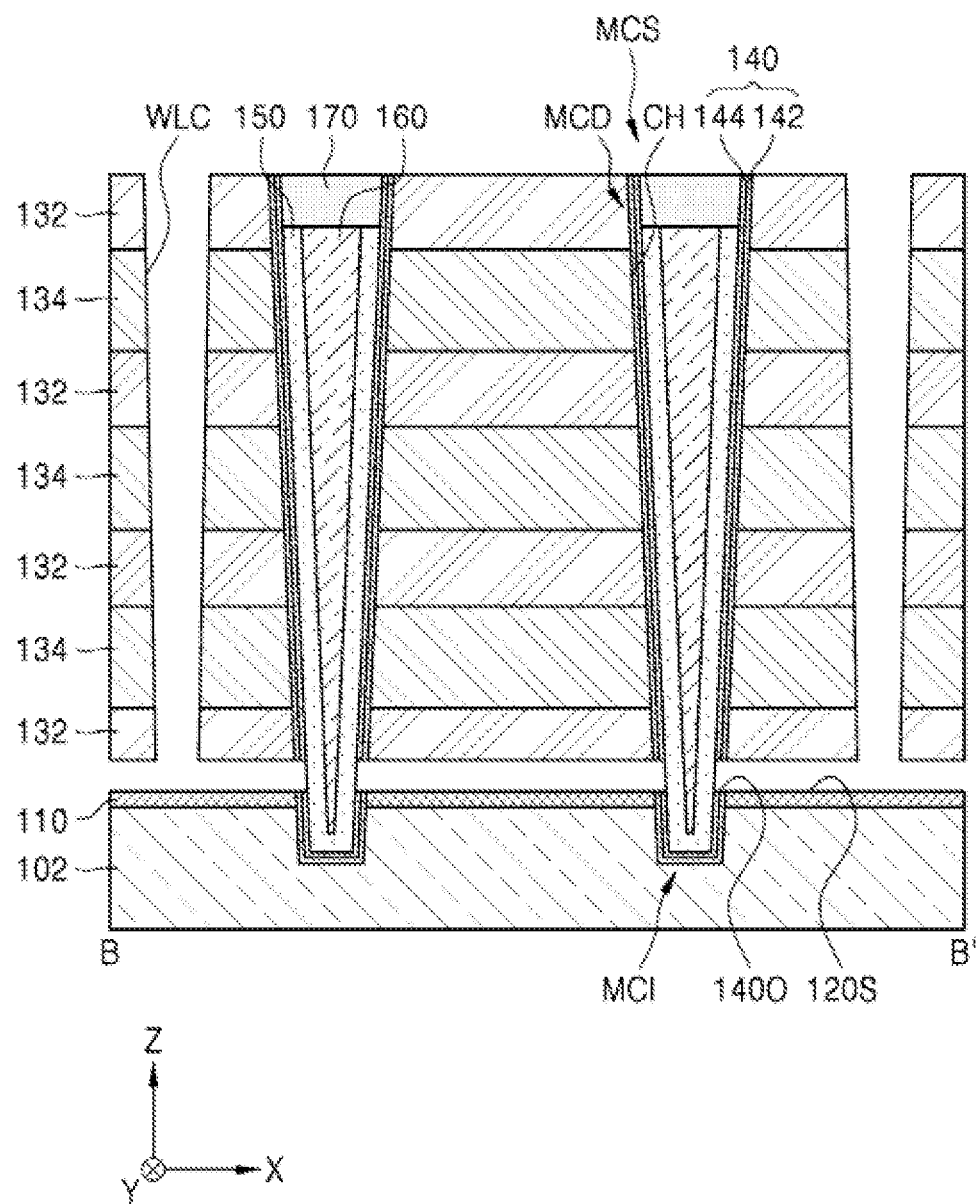

Referring to FIG. 9, the channel opening 140O exposing the channel layer 150 may be formed by removing a portion of the stacked insulating structure 140 exposed to the internal space 120S. The channel opening 140O may be formed by removing a portion of the stacked insulating structure 140 by performing an isotropic etching process using an etchant supplied via the word line cut region WLC and the internal space 120S.

The stacked insulating structure 140 may be separated into the memory cell dielectric layer MCD and the barrier insulating layer MCI by the channel opening 140O. Each of the memory cell dielectric layer MCD and the barrier insulating layer MCI may be a portion of the stacked insulating structure 140 positioned on the upper side and the lower side of the channel opening 140O. The memory cell dielectric layer MCD and the barrier insulating layer MCI may be apart from each other with the channel opening 140O interposed therebetween.

A portion of the gate insulating layer 142 and a portion of the charge trap layer 144 constituting the memory cell dielectric layer MCD may be referred to as the first gate insulating layer and the first charge trap layer, respectively, and a portion of the gate insulating layer 142 and a portion of the charge trap layer 144 constituting the barrier insulating layer MCI may be referred to as the second gate insulating layer and the second charge trap layer, respectively. Accordingly, the first gate insulating layer and the second gate insulating layer may include the channel opening 140O interposed therebetween and be apart from each other, and the first charge trap layer and the second charge trap layer may include the channel opening 140O interposed therebetween and be apart from each other.

Figure 10:
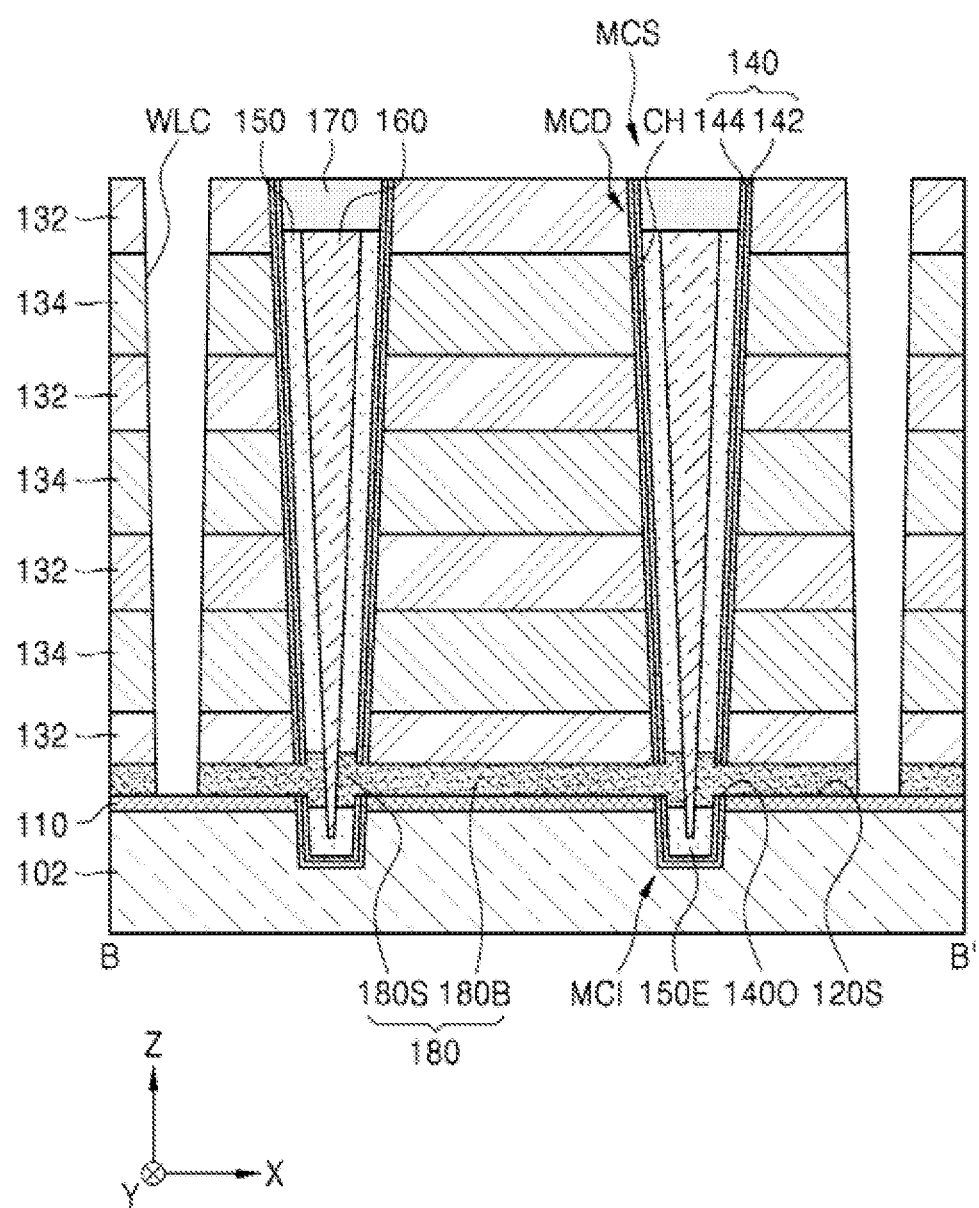

Referring to FIG. 10, the base source layer 180B filling the internal space 120S and the channel opening 140O may be formed. In an embodiment of the present inventive concept, after a preliminary source layer filling the channel opening 140O, the internal space 120S, and the word line cut region WLC is formed, and the base source layer 180B may be formed by removing a portion of the preliminary source layer filling the word line cut region WLC. The preliminary source layer may be formed by performing, for example, a CVD process. In an embodiment of the present inventive concept, the base source layer 180B may be formed by performing a selective epitaxial growth (SEG) process using a portion of the channel layer 150 exposed through the channel opening 140O as a seed.

The base source layer 180B may include a semiconductor material doped with impurities of the second conductivity type. In an embodiment of the present inventive concept, the second conductivity type may be an n-type. For example, the base source layer 180B may include n+ polysilicon (p-Si) doped with n-type impurities (e.g., phosphorus (P), arsenic (As), etc.) at a high concentration.

When the base source layer 180B is formed by performing a CVD process, after an amorphous semiconductor material layer is formed, the amorphous semiconductor material layer may be changed to polysilicon (p-Si) by performing heat treatment, or may be formed as polysilicon (p-Si) in a depositing process by controlling depositing temperature conditions. When the base source layer 180B is formed by performing the SEG process, when a portion of the channel layer 150 used as the seed is polysilicon (p-Si), the base source layer 180B may also include polysilicon (p-Si).

In the process of forming the base source layer 180B, the impurities of the second conductivity type doped on the base source layer 180B may diffuse into the portion of the channel layer 150, and a portion of the channel layer 150 on which the impurities of the second conductivity type have diffused may become the cell source layer 180S. For example, the impurities of the second conductivity type may diffuse laterally in the first and second horizontal directions (X direction and Y direction) from the base source layer 180B into the channel layer 150 through the channel opening 140O, and may also diffuse in the vertical direction (Z direction) upward and downward within the channel layer 150 inside the channel hole CH. The channel layer 150 inside the channel hole CH doped with the impurities of the second conductivity type may then form the cell source layer 180S. In this manner, the common source semiconductor layer 180 including the base source layer 180B and the cell source layer 180S and doped with impurities of the second conductivity type may be formed.

Because the base source layer 180B is formed by filling the channel opening 140O and the internal space 120S, the base source layer 180B may extend in the first and second horizontal directions (X direction and Y direction) with substantially constant vertical height from between the etch stop layer 110 and the lowermost insulating layer 132 of the plurality of insulating layers 132 to the channel opening 140O. In an embodiment of the present inventive concept, the cell source layer 180S may be formed to have a vertical height greater than the vertical height of the base source layer 180B. Because the cell source layer 180S is formed by diffusing impurities of the second conductivity type into the portion of the channel layer 150, the lower surface of the cell source layer 180S may be positioned at a vertical level lower than that of the lower surface of the base source layer 180B, and the upper surface of the cell source layer 180S may be positioned at a vertical level higher than that of the upper surface of the base source layer 180B.

The common source semiconductor layer 180 may include the base source layer 180B extending with substantially the same vertical height in the first and second horizontal directions (X direction and Y direction), and the cell source layer 180S extending from the base source layer 180B and extending to an upper side and a lower side of the cell source layer 180S in the channel hole CH. In other words, the cell source layer 180S may extend in the vertical direction (Z direction) upward and downward inside the channel hole CH, and thus, a vertical height of the lower surface of the cell source layer 180S may be lower than a vertical height of the lower surface of the base source layer 180B, and a vertical height of the upper surface of the cell source layer 180S may be higher than a vertical height of the upper surface of the base source layer 180B.

The memory cell dielectric layer MCD and the barrier insulating layer MCI may include the common source semiconductor layer 180 filling the channel opening 140O disposed therebetween, and may be apart from each other.

As the cell source layer 180S of the common source semiconductor layer 180 is formed, the lower portion of the channel layer 150 may be apart from the remaining portion of the channel layer 150, and is referred to as the buried semiconductor layer 150E. The buried semiconductor layer 150E may fill the lower portion of the channel hole CH extending into the semiconductor substrate 102. Because the buried semiconductor layer 150E is apart from the rest of the channel layer 150 and has the cell source layer 180S disposed therebetween, the buried semiconductor layer 150E may include a material the same as that of the rest of the channel layer 150. In an embodiment of the present inventive concept, the buried semiconductor layer 150E may include intrinsic polysilicon (p-Si) which is not doped with impurities. In an embodiment of the present inventive concept, the channel layer 150 may include polysilicon (p-Si) of a relatively low doping concentration of p0.

Figure 11A:
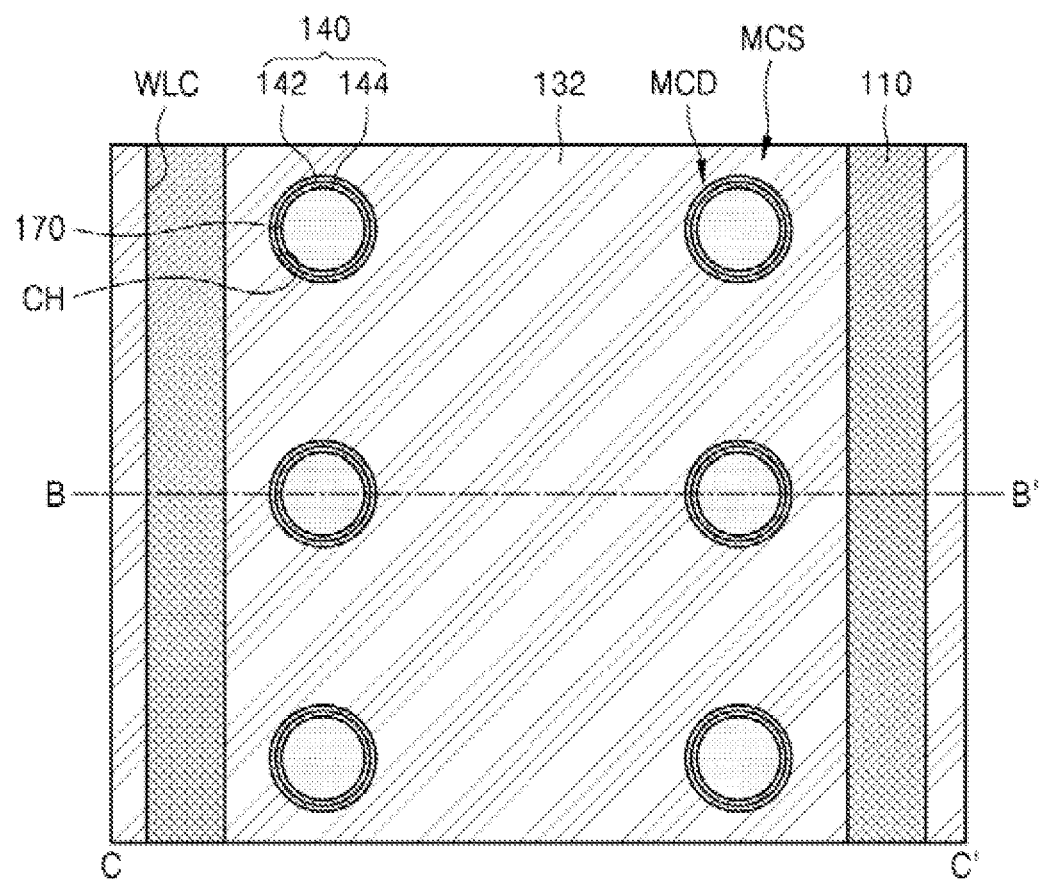
Figure 11B:
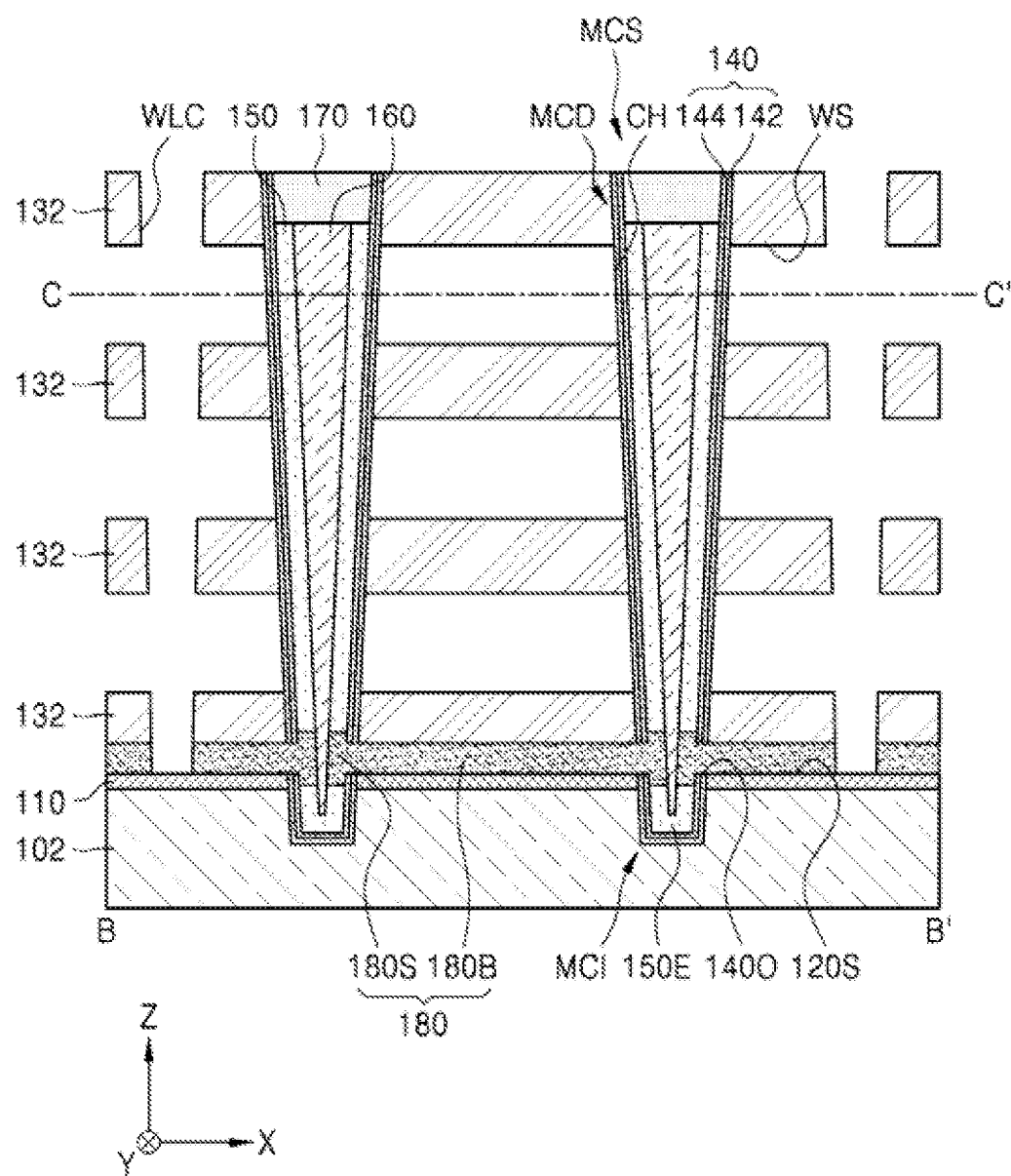
Figure 11C:
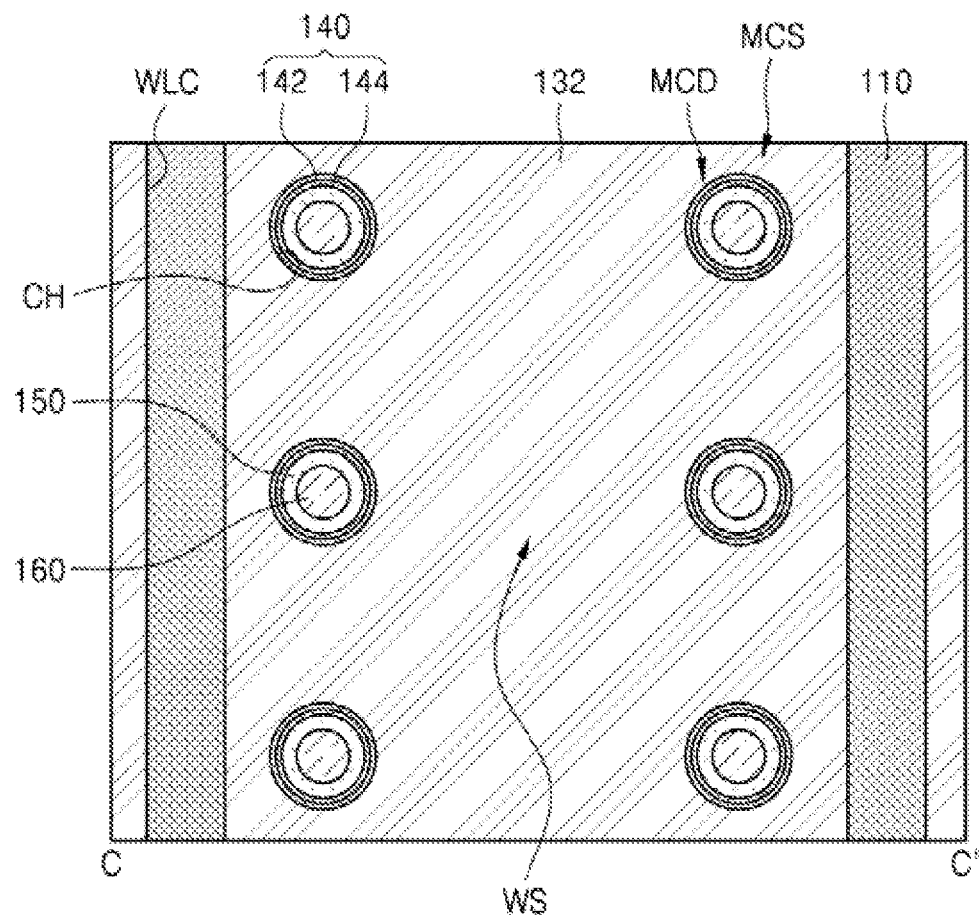

Referring to FIGS. 10 through 11C together, by removing the plurality of sacrificial layers 134 via the word line cut region WLC, a plurality of word line spaces WS interconnecting to the word line cut region WLC may be formed. The plurality of sacrificial layers 134 may be removed by performing an isotropic etching process using an etchant supplied via the word line cut region WLC. For example, the plurality of sacrificial layers 134 may be selectively removed with respect to the plurality of insulating layers 132 and the etch stop layer 110 using a wet etching process which is an isotropic etching process. Alternatively, an isotropic dry etching process may be used to selectively remove the plurality of sacrificial layers 134. For example, when the plurality of sacrificial layers 134 are formed of silicon nitride ($Si_3N_4$) and the plurality of insulating layers 132 are formed of silicon oxide ($SiO_2$), the plurality of sacrificial layers 134 may be removed by an etching process using an etching solution including phosphoric acid ($H_3PO_4$). However, the present inventive concept is not limited thereto.

Figure 12A:
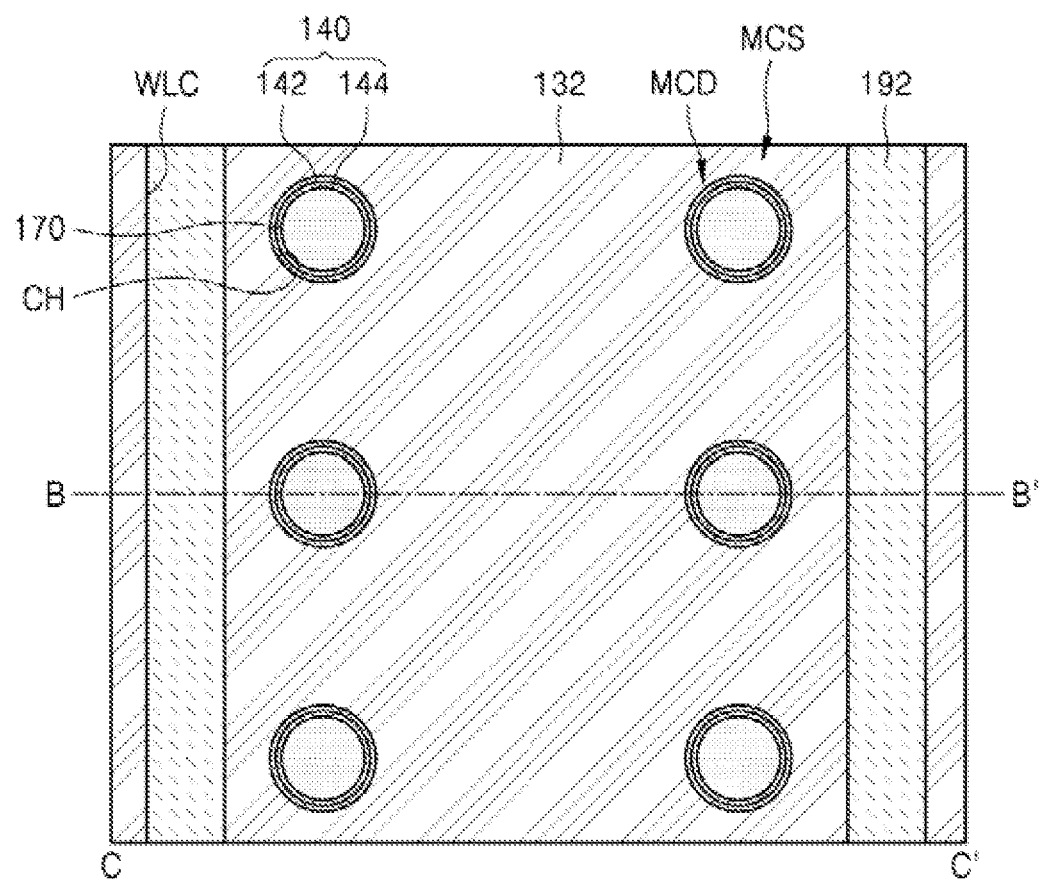
Figure 12B:
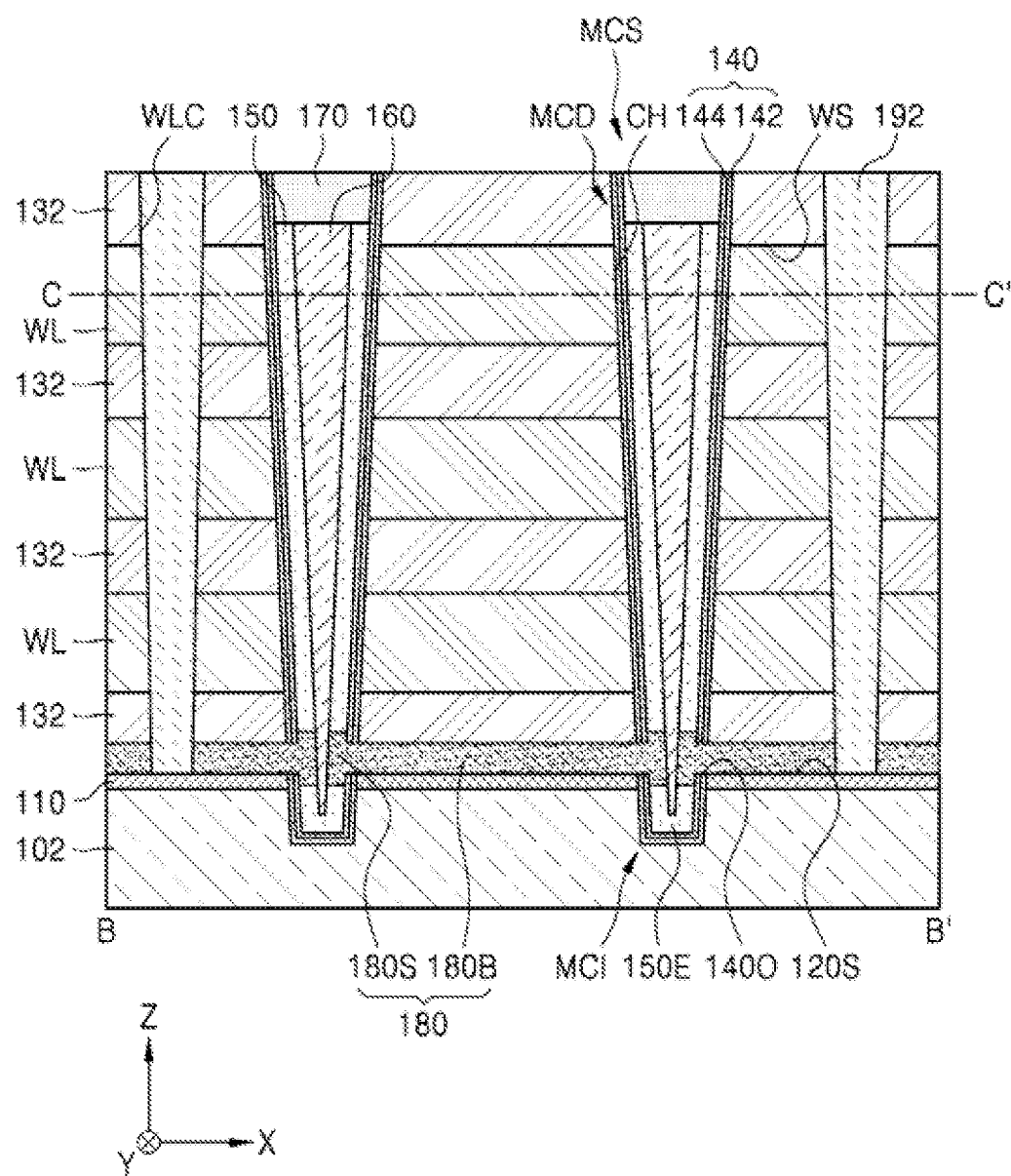
Figure 12C:
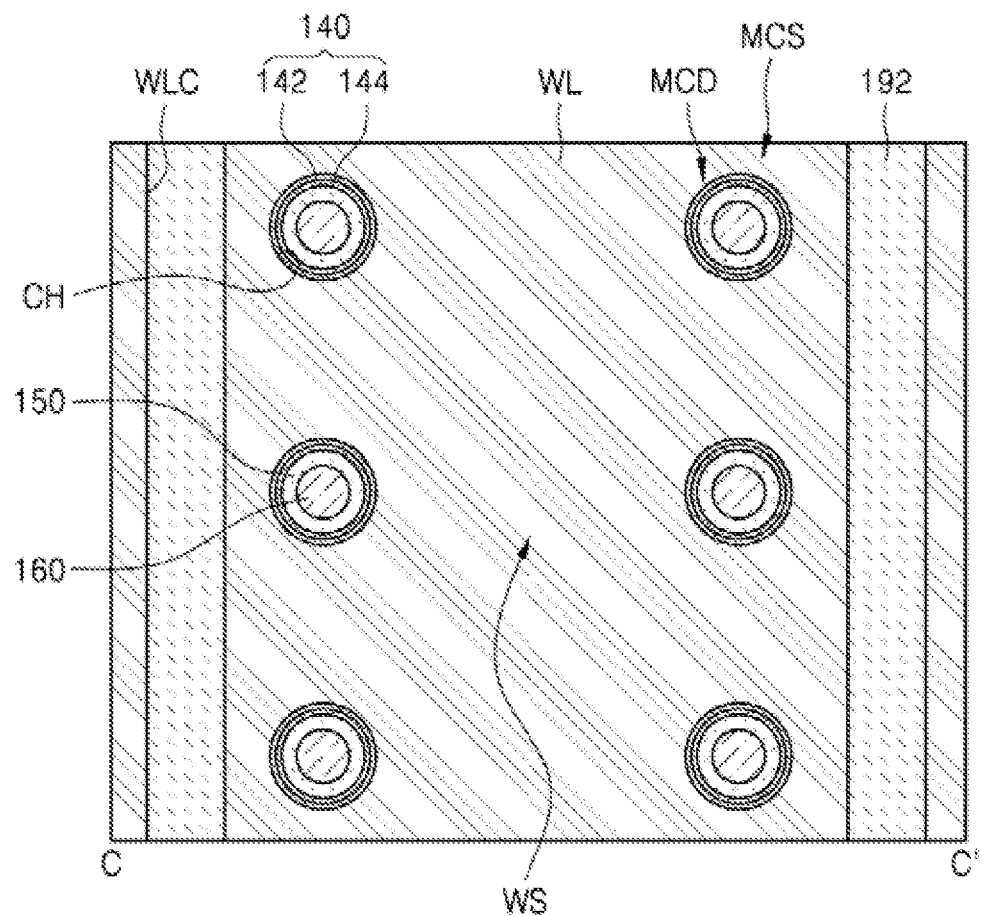

Referring to FIGS. 12A and 12B together, the plurality of word line structures WL filling the plurality of word line spaces WS. After the word line material layer filling the plurality of word line spaces WS and the word line cut region WLC is formed, the plurality of word line structures WL may be formed by removing a portion of the word line material layer formed in the word line cut region WLC.

The plurality of word line structures WL may extend in the first and second horizontal directions (X direction and Y direction) on the semiconductor substrate 102, and overlap each other in the vertical direction (Z direction) perpendicular to the semiconductor substrate 102. The word line structure WL may include a metal such as, for example, tungsten (W), nickel (Ni), cobalt (Co), and/or tantalum (Ta), a metal silicide such as, for example, tungsten silicide ($WSi_x$), nickel silicide ($NiSi_x$), cobalt silicide ($CoSi_x$), and/or tantalum silicide ($TaSi_x$), polysilicon (p-Si) doped with impurities, or a combination thereof.

After the plurality of word line structures WL are formed, the buried insulating layer 192 filling the word line cut region WLC may be formed. For example, the buried insulating layer 192 may include, for example, an oxide layer, a nitride layer, or a combination thereof. In an embodiment of the present inventive concept, the buried insulating layer 192 may include a material the same as that of the insulating layer 132.

Figure 13A:
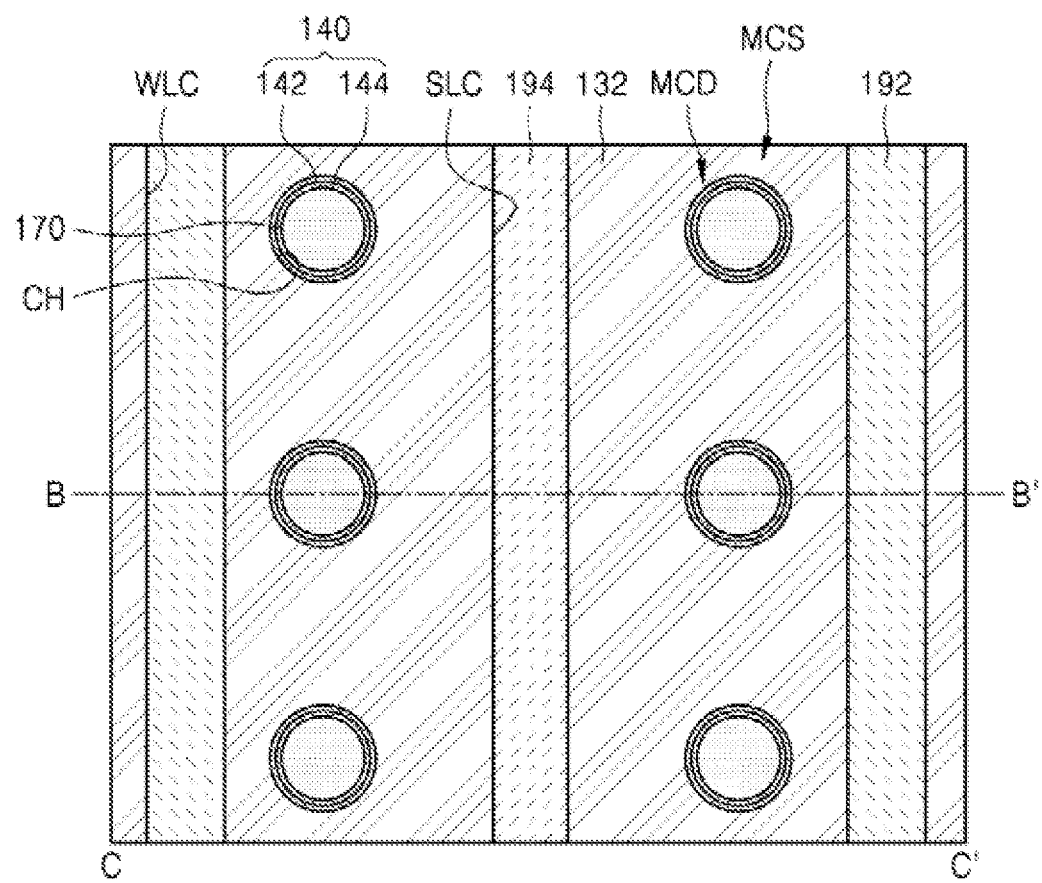
Figure 13B:
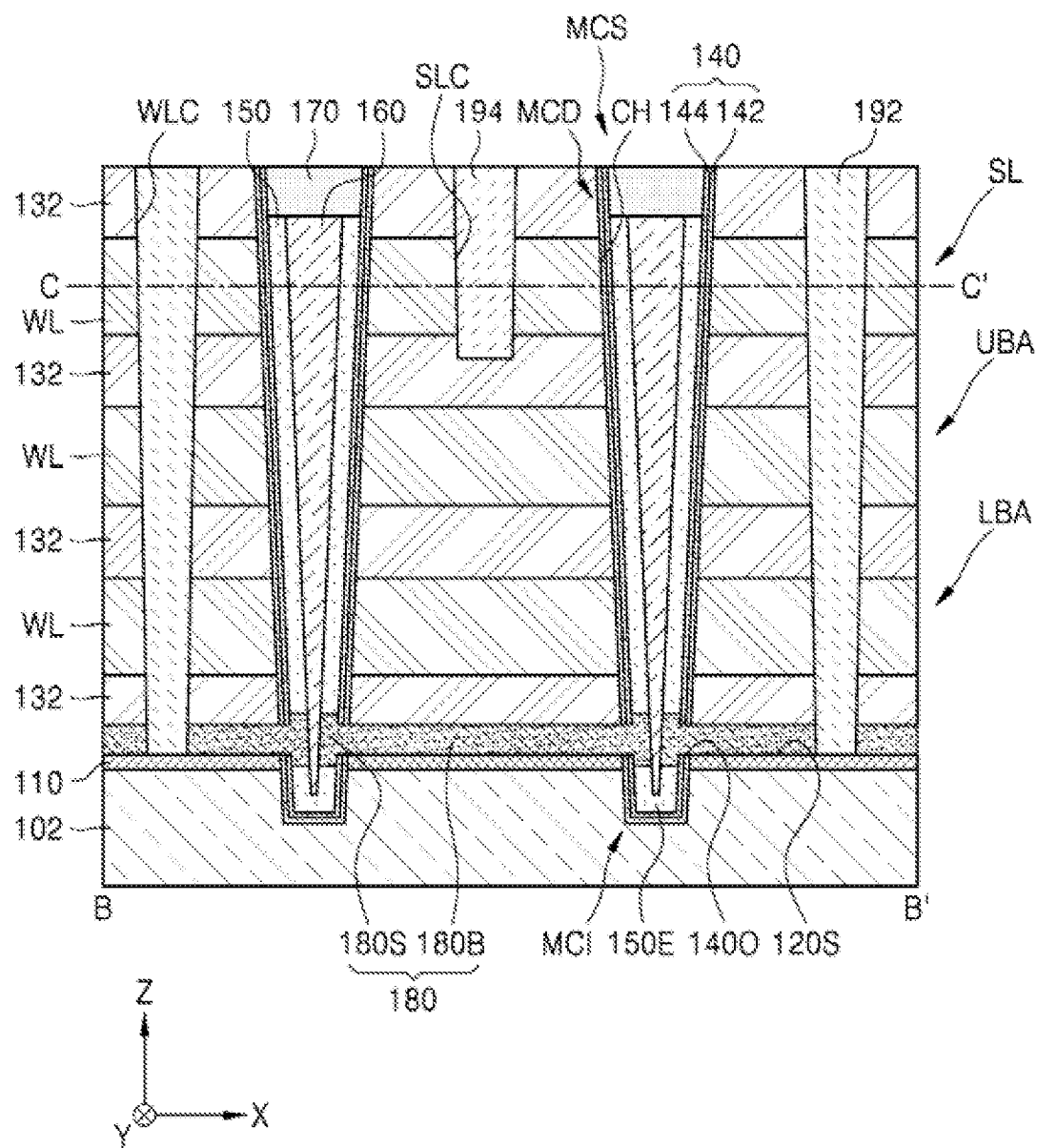
Figure 13C:
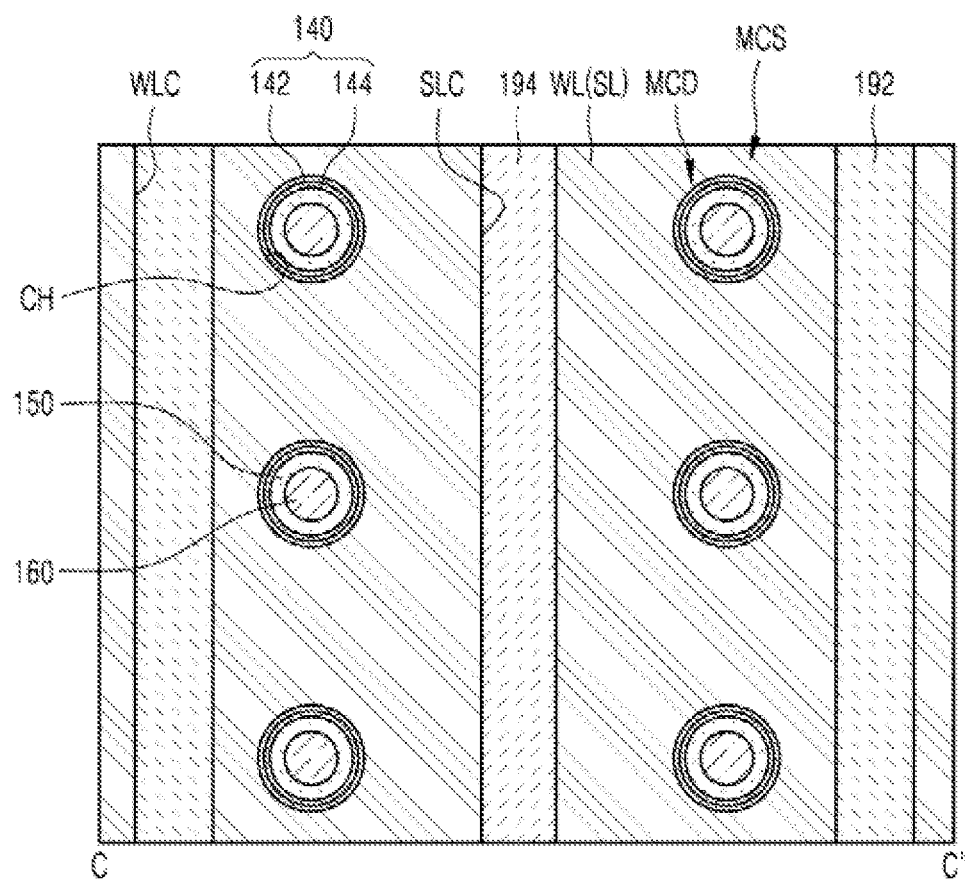

Referring to FIGS. 13A through 13C, the select line cut region SLC penetrating the uppermost insulating layer 132 of the plurality of insulating layers 132 and the uppermost word line structure WL of the plurality of word line structures WL may be formed. The select line cut region SLC may be formed by performing an anisotropic etching to remove a portion of each of the uppermost insulating layer 132 of the plurality of insulating layers 132 and the uppermost word line structure WL of the plurality of word line structures WL so that a next to uppermost insulating layer 132 of the plurality of insulating layers 132 in contact with the lower surface of the uppermost word line structure WL is exposed. In an embodiment of the present inventive concept, the select line cut region SLC may extend into the next to uppermost insulating layer 132 of the plurality of insulating layers 132 in contact with the lower surface of the uppermost word line structure WL. In an embodiment of the present inventive concept, the select line cut region SLC may extend in the second horizontal direction (Y direction).

Thereafter, the select line cut region SLC may be filled by the isolation insulating layer 194. For example, the isolation insulating layer 194 may include, for example, an oxide layer, a nitride layer, or a combination thereof. In an embodiment of the present inventive concept, the isolation insulating layer 194 which fills the select line cut region SLC may include a material the same as that of the buried insulating layer 192 which fills the word line cut region WLC.

The uppermost word line structure WL separated by the select line cut region SLC may become the select line SL. The upper word line structure WL of the word line structures WL, which are referred to as a plurality of word lines and are not separated by the select line cut region SLC but separated by the word line cut region WLC, may be the first barrier line UBA, and the lower word line structure WL thereof may be the second barrier line LBA.

Thereafter, as illustrated in FIGS. 1A through 1C, the semiconductor memory device 1 may be formed by forming the plurality of bit lines BL arranged on the plurality of insulating layers 132, and electrically connected to the plurality of the drain layers 170. In an embodiment of the present inventive concept, the plurality of bit lines BL may have a substantially constant distance from each other in the second horizontal direction (Y direction), and may extend in the first horizontal direction (X direction).

FIGS. 14 through 17 are cross-sectional views of semiconductor memory devices each according to an embodiment of the present inventive concept. In FIGS. 14 through 17, the same member numbers as those in FIGS. 1A through 13C may denote the same components, and duplicate descriptions thereof may be omitted.

Figure 14:
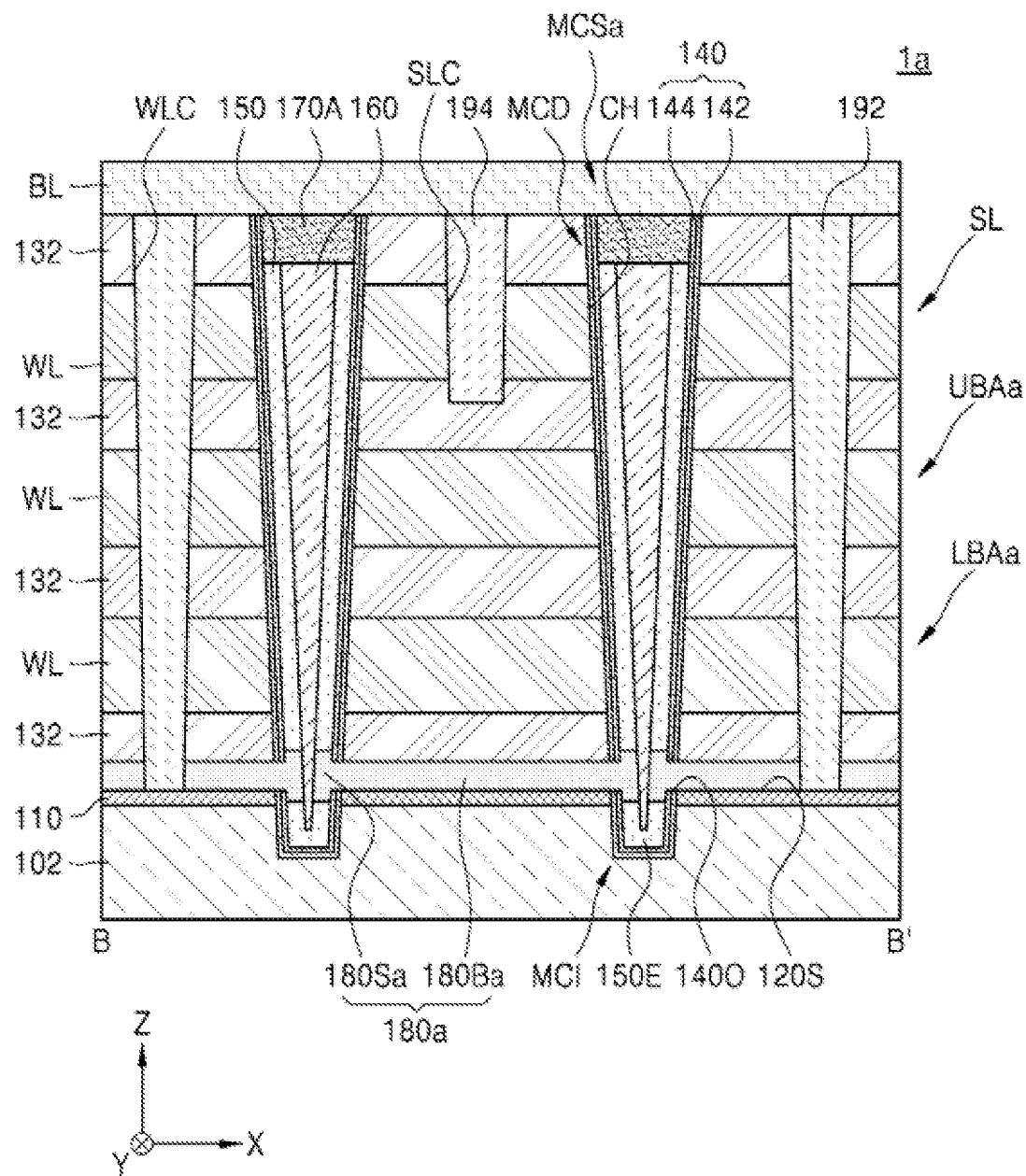
FIGS. 14 through 17 are cross-sectional views of semiconductor memory devices each according to an embodiment of the present inventive concept.

Referring to FIG. 14, a semiconductor memory device 1a may include a common source semiconductor layer 180a arranged on a semiconductor substrate 102, a plurality of insulating layers 132 arranged on the common source semiconductor layer 180a and being apart from each other in the vertical direction (Z direction), a plurality of word line structures WL placed between the plurality of insulating layers 132 and being apart from each other in the vertical direction (Z direction), and a plurality of memory cell structures MCSa extending in the vertical direction (Z direction). For example, the plurality of insulating layers 132 and the plurality of word line structures WL may be alternately stacked on the common source semiconductor layer 180a arranged on the semiconductor substrate 102. The plurality of memory cell structures MCSa may be placed inside a plurality of channel holes CH which penetrate the plurality of insulating layers 132, the plurality of word line structures WL, and the plurality of common source semiconductor layers 180a, and extend into the semiconductor substrate 102. An etch stop layer 110 may be placed between the semiconductor substrate 102 and the common source semiconductor layer 180a.

The memory cell dielectric layer MCD may have a substantially constant thickness and may conformally cover the internal wall of the channel hole CH. The memory cell structures MCSa may include the channel layers 150 that include the memory cell dielectric layers MCD disposed therebetween or thereon and cover at least portions of the channel holes CH, and drain layers 170*a* that cover upper surfaces of the channel layers 150 and fill portions of upper sides of the channel holes CH. The memory cell structure MCSa may further include the filling insulating layer 160 filling the inside of the channel layer 150 having a cylindrical shape or a circular tube shape. The upper surface of the channel layer 150 may contact the drain layer 170*a*, and the lower surface of the channel layer 150 may contact the common source semiconductor layer 180*a*. The buried semiconductor layer 150E may fill the lower portion of the channel hole CH extending into the semiconductor substrate 102. The buried semiconductor layer 150E may be apart from the channel layer 150 with the common source semiconductor layer 180*a* disposed therebetween.

The drain layer 170*a* may include a semiconductor material doped with impurities of the second conductivity type. In an embodiment of the present inventive concept, the second conductivity type may be an n-type. For example, the drain layer 170*a* may include n+ polysilicon (p-Si) doped with n-type impurities (e.g., phosphorus (P), arsenic (As), etc.) at a high concentration. The common source semiconductor layer 180*a* may include a semiconductor material doped with impurities of the first conductivity type. In an embodiment of the present inventive concept, the first conductivity type may be a p-type. For example, the common source semiconductor layer 180*a* may include p+ polysilicon (p-Si) doped with p-type impurities (e.g., boron (B), aluminum (Al), gallium (Ga), etc.) at a high concentration.

The common source semiconductor layer 180*a* may include a base source layer 180Ba extending in the horizontal directions (X and Y directions) between the etch stop layer 110 and the lowermost insulating layer 132 of the plurality of insulating layers 132, and the cell source layer 180Sa extending from the base source layer 180Ba and arranged between the channel layer 150 and the buried semiconductor layer 150E in the channel hole CH. For example, the common source semiconductor layer 180*a* may include the base source layer 180Ba extending with substantially the same vertical height on a horizontal plane (XY plane), and the cell source layer 180Sa extending from the base source layer 180Ba and extending to the upper side and the lower side of the channel hole CH inside the channel hole CH. In other words, the cell source layer 180Sa may extend in the vertical direction (Z direction) upward and downward inside the channel hole CH, and thus, a vertical height of the lower surface of the cell source layer 180Sa may be lower than a vertical height of the lower surface of the base source layer 180Ba, and a vertical height of the upper surface of the cell source layer 180Sa may be higher than a vertical height of the upper surface of the base source layer 180Ba.

A word line cut region WLC may penetrate the plurality of insulating layers 132, the plurality of word line structures WL, and the common source semiconductor layer 180*a*. A select line cut region SLC may penetrate the uppermost insulating layer 132 of the plurality of insulating layers 132 and the uppermost word line structure WL of the plurality of word line structures WL.

The uppermost word line structure WL separated by the select line cut region SLC of the plurality of word line structures WL may include a select line SL. For the two word line structures WL that are not separated by the select line cut region SLC and are separated by the word line cut region WLC, the upper word line structure WL may include a first barrier line UBAa, and the lower word line structure WL may include a second barrier line LBAa.

The plurality of bit lines BL electrically connected to the drain layers 170*a* may be arranged on the plurality of insulating layers 132.

When the first barrier voltage VA with a relatively low voltage is applied to the first barrier line UBAa, the channel layer 150 adjacent to the first barrier line UBAa may become a region of the first conductivity type (i.e., p-type), and when the second barrier voltage VB with a relatively high voltage is applied to the second barrier line LBAa, the channel layer 150 adjacent to the second barrier line LBAa may become a region of the second conductivity type (i.e., n-type).

The semiconductor memory device 1*a* may provide, for example, a relatively low voltage to the first barrier line UBAa, and a relatively high voltage to the second barrier line LBAa, so that the memory cell structure MCSa forms the thyristor of an npnp structure. For example, a voltage of about −5 V may be provided to the first barrier line UBAa, and a voltage of about 5 V may be provided to the second barrier line LBAa.

The semiconductor memory device 1*a* according to the present inventive concept may allow each of the plurality of memory cell structures MCSa to have the thyristor of the npnp structure, and thus, may function as a DRAM capable of performing the write operation, for example, by providing a trigger voltage, and the read operation, for example, by providing about ½ of the trigger voltage on two current states of the high current state and the low current state, that is, on the stored data of 1 bit for each of the plurality of memory cell structures MCSa, respectively, and carriers may be trapped in the charge trap layer 144 in contact with the channel layer 150, and accordingly, retention time and memory window characteristics may be enhanced.

Figure 15:
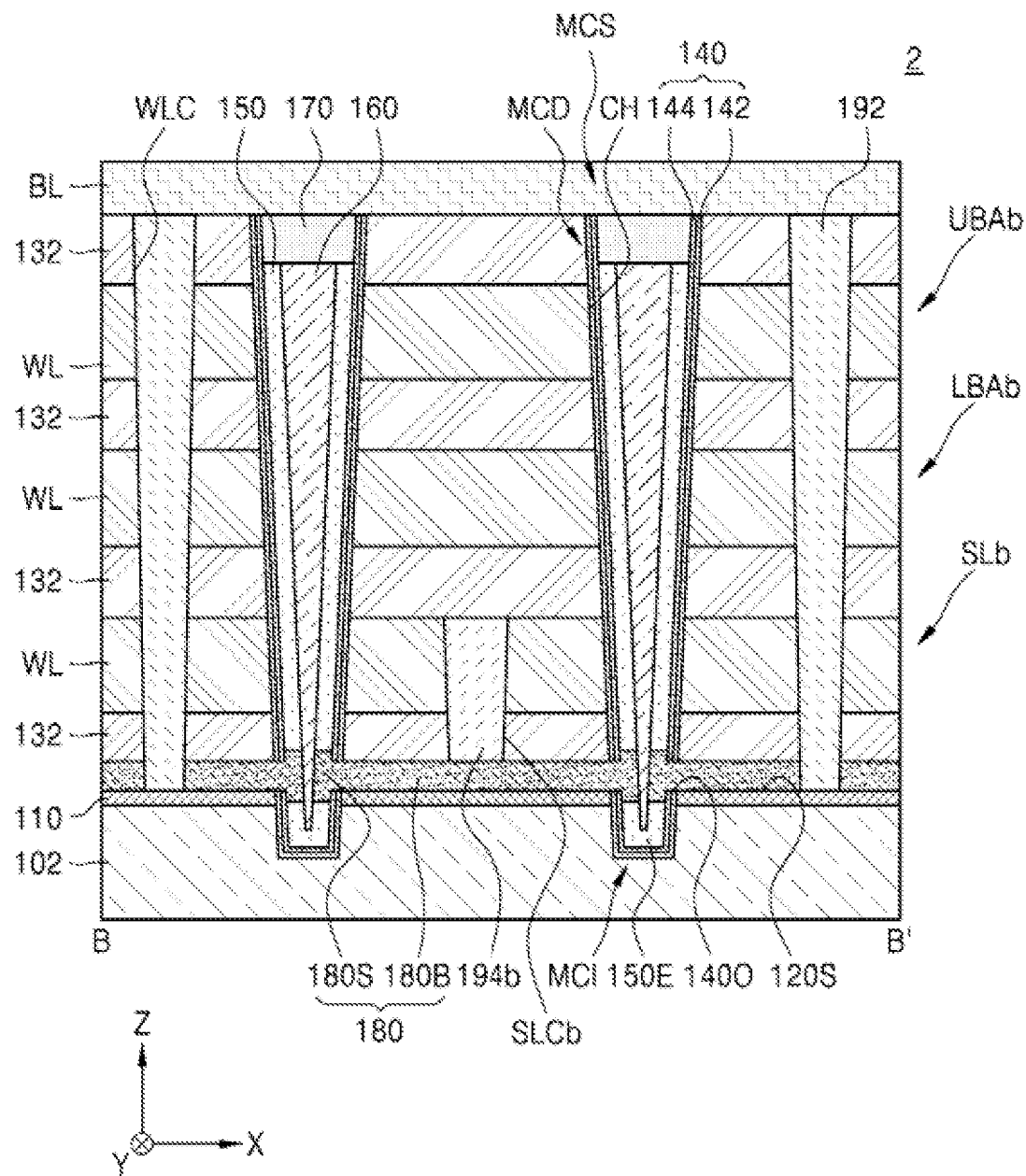

Referring to FIG. 15, a semiconductor memory device 2 may include the common source semiconductor layer 180 arranged on the semiconductor substrate 102, the plurality of insulating layers 132 arranged on the common source semiconductor layer 180 and being apart from each other in the vertical direction (Z direction), a plurality of word line structures WL placed between the plurality of insulating layers 132 and being apart from each other in the vertical direction (Z direction), and the plurality of memory cell structures MCS extending in the vertical direction (Z direction). For example, the plurality of insulating layers 132 and the plurality of word line structures WL may be alternately stacked on the common source semiconductor layer 180 arranged on the semiconductor substrate 102. The memory cell dielectric layer MCD may have a substantially constant thickness and may conformally cover the internal wall of the channel hole CH.

The select line cut region SLC may penetrate the lowermost insulating layer 132 of the plurality of insulating layers 132 and the lowermost word line structure WL of the plurality of word line structures WL.

The drain layer 170 may include a semiconductor material doped with impurities of the first conductivity type (i.e., p-type), and the common source semiconductor layer 180 may include a semiconductor material doped with impurities of a second conductivity type (i.e., n-type) different from the first conductivity type (i.e., p-type).

The lowermost word line structure WL separated by the select line cut region SLCb of the plurality of word line structures WL may include a select line SLb. For the two word line structures WL that are not separated by the select line cut region SLCb and are separated by the word line cut region WLC, the upper word line structure WL may include a first barrier line UBAb, and the lower word line structure WL may include a second barrier line LBAb.

When the first barrier voltage VA with a relatively high voltage is applied to the first barrier line UBAb, the channel layer 150 adjacent to the first barrier line UBAb may become a region of the second conductivity type (i.e., n-type), and when the second barrier voltage VB with a relatively low voltage is applied to the second barrier line LBAb, the channel layer 150 adjacent to the second barrier line LBAb may become a region of the first conductivity type (i.e., p-type).

The semiconductor memory device 2 may provide, for example, a relatively high voltage to the first barrier line UBAb, and a relatively low voltage to the second barrier line LBAb, so that the memory cell structure MCS forms the thyristor of a pnpn structure. A voltage capable of selecting one memory cell structure MCS from the plurality of memory cell structures MCS may be provided to the select line SLb. For example, a voltage of about 5 V may be provided to the first barrier line UBAb, and a voltage of about −5 V may be provided to the second barrier line LBAb.

The semiconductor memory device 2 according to the present inventive concept may allow each of the plurality of memory cell structures MCS to have the thyristor of the pnpn structure, and thus, may function as a DRAM capable of performing the write operation, for example, by providing a trigger voltage, and the read operation, for example, by providing about ½ of the trigger voltage on two current states of the high current state and the low current state, that is, on the stored data of 1 bit for each of the plurality of memory cell structures MCS, respectively, and carriers may be trapped in the charge trap layer 144 in contact with the channel layer 150, and accordingly, retention time and memory window characteristics may be enhanced.

Figure 16:
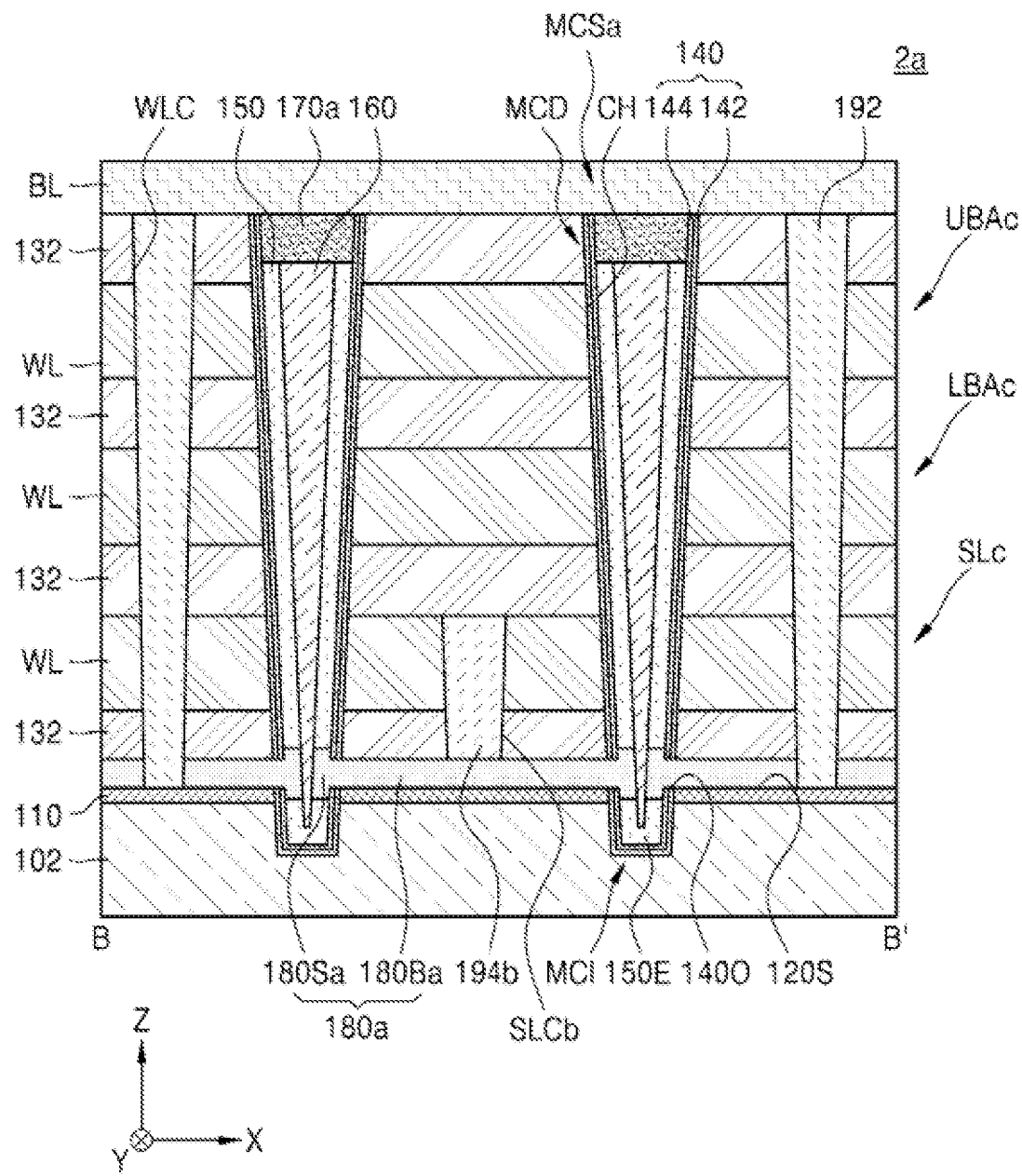

Referring to FIG. 16, a semiconductor memory device 2a may include a common source semiconductor layer 180a arranged on a semiconductor substrate 102, a plurality of insulating layers 132 arranged on the common source semiconductor layer 180a and being apart from each other in the vertical direction (Z direction), a plurality of word line structures WL placed between the plurality of insulating layers 132 and being apart from each other in the vertical direction (Z direction), and a plurality of memory cell structures MCSa extending in the vertical direction (Z direction). For example, the plurality of insulating layers 132 and the plurality of word line structures WL may be alternately stacked on the common source semiconductor layer 180a arranged on the semiconductor substrate 102. The plurality of memory cell structures MCSa may be placed inside a plurality of channel holes CH which penetrate the plurality of insulating layers 132, the plurality of word line structures WL, and the plurality of common source semiconductor layers 180a, and extend into the semiconductor substrate 102. The etch stop layer 110 may be placed between the semiconductor substrate 102 and the common source semiconductor layer 180a.

The memory cell dielectric layer MCD may have a substantially constant thickness and may conformally cover the internal wall of the channel hole CH. The memory cell structures MCSa may include the channel layers 150 that include the memory cell dielectric layers MCD disposed thereon and cover at least portions of the channel holes CH, and drain layers 170a that cover upper surfaces of the channel layers 150 and fill portions of upper sides of the channel holes CH. The memory cell structure MCSa may further include the filling insulating layer 160 filling the inside of the channel layer 150 having a cylindrical shape or a circular tube shape. The upper surface of the channel layer 150 may contact the drain layer 170a, and the lower surface of the channel layer 150 may contact the common source semiconductor layer 180a. The buried semiconductor layer 150E may fill the lower portion of the channel hole CH extending into the semiconductor substrate 102. The buried semiconductor layer 150E may be apart from the channel layer 150 with the common source semiconductor layer 180a disposed therebetween.

The drain layer 170a may include a semiconductor material doped with impurities of the second conductivity type. In an embodiment of the present inventive concept, the second conductivity type may be an n-type. The common source semiconductor layer 180a may include a semiconductor material doped with impurities of the first conductivity type. In an embodiment of the present inventive concept, the first conductivity type may be a p-type.

The common source semiconductor layer 180a may include a base source layer 180Ba extending in the horizontal directions (X and Y directions) between the etch stop layer 110 and the lowermost insulating layer 132 of the plurality of insulating layers 132, and the cell source layer 180Sa extending from the base source layer 180Ba and arranged between the channel layer 150 and the buried semiconductor layer 150E in the channel hole CH.

A word line cut region WLC may penetrate the plurality of insulating layers 132, the plurality of word line structures WL, and the common source semiconductor layer 180a. The select line cut region SLCb may penetrate the lowermost insulating layer 132 of the plurality of insulating layers 132 and the lowermost word line structure WL of the plurality of word line structures WL.

The lowermost word line structure WL separated by the select line cut region SLCb of the plurality of word line structures WL may include a select line SLc. For the two word line structures WL that are not separated by the select line cut region SLCb and are separated by the word line cut region WLC, the upper word line structure WL may include a first barrier line UBAc, and the lower word line structure WL may include a second barrier line LBAc.

The plurality of bit lines BL electrically connected to the drain layers 170a may be arranged on the plurality of insulating layers 132.

When the first barrier voltage VA with a relatively low voltage is applied to the first barrier line UBAc, the channel layer 150 adjacent to the first barrier line UBAc may become a region of the first conductivity type (i.e., p-type), and when the second barrier voltage VB with a relatively high voltage is applied to the second barrier line LBAc, the channel layer 150 adjacent to the second barrier line LBAc may become a region of the second conductivity type (i.e., n-type).

The semiconductor memory device 2a may provide, for example, a relatively low voltage to the first barrier line UBAc, and a relatively high voltage to the second barrier line LBAc, so that the memory cell structure MCSa forms the thyristor of an npnp structure. For example, a voltage of about −5 V may be provided to the first barrier line UBAc, and a voltage of about 5 V may be provided to the second barrier line LBAc.

The semiconductor memory device 2a according to the present inventive concept may allow each of the plurality of memory cell structures MCSa to have the thyristor of the npnp structure, and thus, may function as a DRAM capable of performing the write operation, for example, by providing a trigger voltage, and the read operation, for example, by providing about ½ of the trigger voltage on two current states of the high current state and the low current state, that is, on the stored data of 1 bit for each of the plurality of memory cell structures MCSa, respectively, and carriers may be trapped in the charge trap layer 144 in contact with the channel layer 150, and accordingly, retention time and memory window characteristics may be enhanced.

Figure 17:
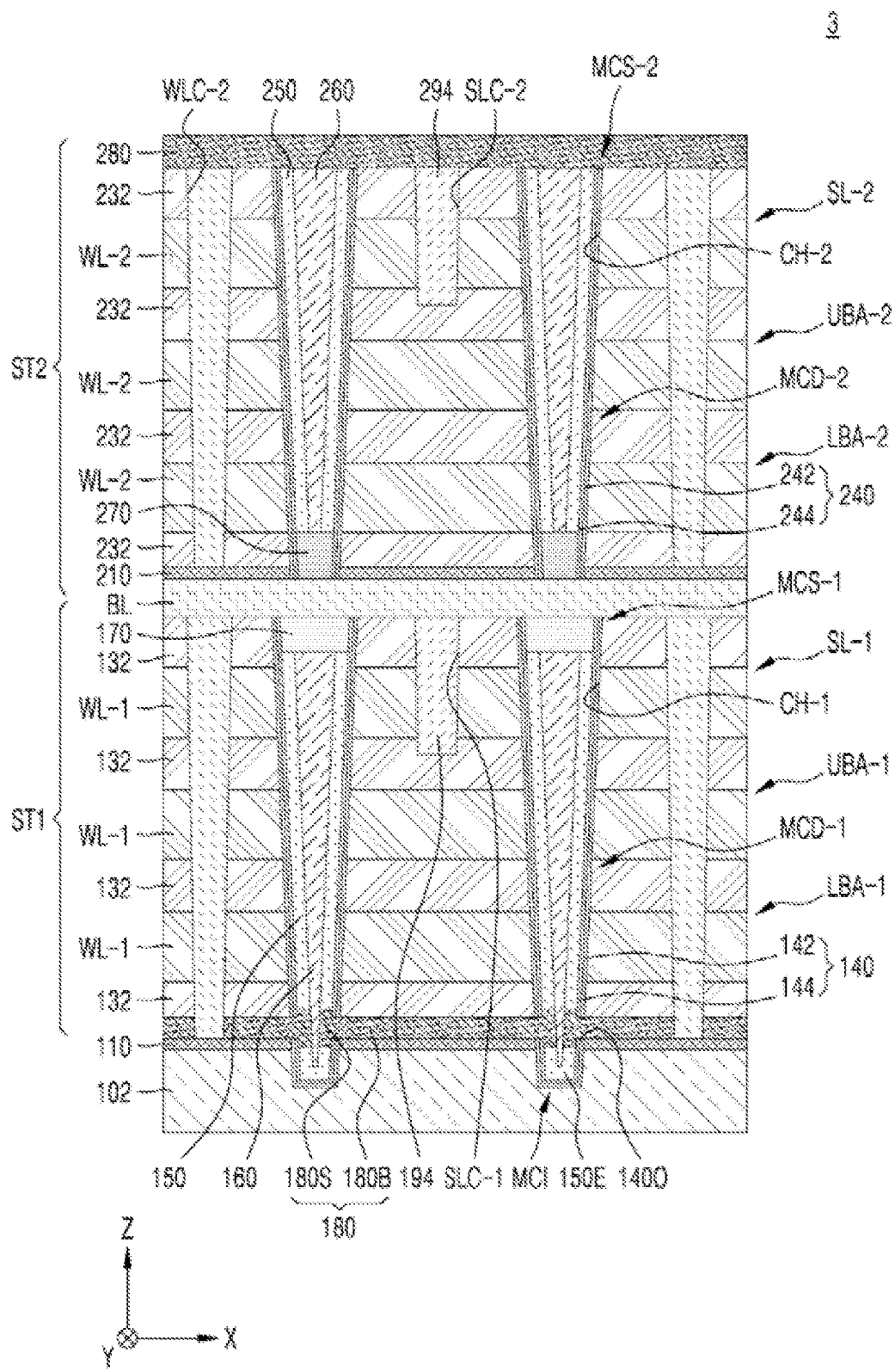

Referring to FIG. 17, a semiconductor memory device 3 may include a first memory stack ST1 arranged on the semiconductor substrate 102 and a second memory stack ST2 stacked on the first memory stack ST1. The etch stop layer 110 may be placed between the semiconductor substrate 102 and the first memory stack ST1. FIG. 17 illustrates that the semiconductor memory device 3 includes two memory stacks including the first memory stack ST1 and the second memory stack ST2 are stacked on the semiconductor substrate 102, but the present inventive concept is not limited thereto. For example, the semiconductor memory device 3, may include three or more memory stacks stacked on the semiconductor substrate 102.

The first memory stack ST1 may include a plurality of first insulating layers 132 apart from each other in the vertical direction (Z direction) on a first common source semiconductor layer 180, a plurality of first word line structure WL-1 arranged between the plurality of insulating layers 132 and apart from each other in the vertical direction (Z direction), and a plurality of first memory cell structure MCS-1 extending in the vertical direction (Z direction). For example, the plurality of insulating layers 132 and the plurality of word line structures WL-1 may be alternately stacked on the common source semiconductor layer 180 arranged on the semiconductor substrate 102. A first memory cell dielectric layer MCD-1 may have a substantially constant thickness and may conformally cover the internal wall of a first channel hole CH-1. The first memory cell dielectric layer MCD-1 may include a first stacked insulating structure 140 including the first gate insulating layer 142 and the first charge trap layer 144. The first memory cell structure MCS-1 may include a first channel layer 150 including the first memory cell dielectric layer MCD-1 disposed thereon and filling at least a portion of the first channel hole CH-1, and a first drain layer 170 covering the upper surface of the first channel layer 150 and filling a portion of an upper side of the first channel hole CH-1. The first memory cell structure MCS-1 may further include a first filling insulating layer 160 filling the inside of the first channel layer 150 having a cylindrical shape or a circular tube shape. The buried semiconductor layer 150E may fill a lower portion of the first channel hole CH-1 extending into the semiconductor substrate 102.

A first word line cut region WLC-1 may penetrate the plurality of first insulating layers 132, the plurality of first word line structures WL-1, and a first common source semiconductor layer 180. A first select line cut region SLC-1 may penetrate the uppermost first insulating layer 132 of the plurality of first insulating layers 132 and the uppermost first word line structure WL-1 of the plurality of first word line structures WL-1.

The uppermost first word line structure WL-1 separated by the first select line cut region SLC-1 of the plurality of first word line structures WL-1 may be a first select line SL-1. For the two first word line structures WL-1 that are not separated by the first select line cut region SLC-1 but are separated by the first word line cut region WLC-1, the upper first word line structure WL-1 may include a first lower barrier line UBA-1, and the lower first word line structure WL-1 may include a second lower barrier line LBA-1.

The plurality of bit lines BL electrically connected to the first drain layers 170 may be arranged on the plurality of first insulating layers 132.

The first common source semiconductor layer 180, the first insulating layer 132, the first word line structure WL-1, the first memory cell structure MCS-1, the first memory cell dielectric layer MCD-1, the first stacked insulating structure 140, the first gate insulating layer 142, the first charge trap layer 144, the first channel hole CH-1, the first channel layer 150, the first drain layer 170, the first filling insulating layer 160, the first word line cut region WLC-1, the first select line cut region SLC-1, the first select line SL-1, the first lower barrier line UBA-1, and the second lower barrier line LBA-1 may be substantially the same as the common source semiconductor layer 180, the insulating layer 132, the word line structure WL, the memory cell structure MCS, the memory cell dielectric layer MCD, the stacked insulating structure 140, the gate insulating layer 142, the charge trap layer 144, the channel hole CH, the channel layer 150, the drain layer 170, the filling insulating layer 160, the word line cut region WLC, the select line cut region SLC, the select line SL, the first barrier line UBA, and the second barrier line LBA, which have been described with reference to FIGS. 1A through 1D, respectively.

The second memory stack ST2 may include a second common source semiconductor layer 280, a second insulating layer 232, a second word line structure WL-2, a second memory cell structure MCS-2, a second memory cell dielectric layer MCD-2, a second stacked insulating structure 240, a second gate insulating layer 242, a second charge trap layer 244, a second channel hole CH-2, a second channel layer 250, a second drain layer 270, a second filling insulating layer 260, a second word line cut region WLC-2, a second select line cut region SLC-2, a second select line SL-2, a first upper barrier line UBA-2, and a second upper barrier line LBA-2.

The second common source semiconductor layer 280, the second insulating layer 232, the second word line structure WL-2, the second memory cell structure MCS-2, the second memory cell dielectric layer MCD-2, the second stacked insulating structure 240, the second gate insulating layer 242, the second charge trap layer 244, the second channel hole CH-2, the second channel layer 250, the second drain layer 270, the second filling insulating layer 260, the second word line cut region WLC-2, the second select line cut region SLC-2, the second select line SL-2, the first upper barrier line UBA-2, and the second upper barrier line LBA-2, which are included in the second memory stack ST2, may be substantially similar to the first common source semiconductor layer 180, the first insulating layer 132, the first word line structure WL-1, the first memory cell structure MCS-1, the first memory cell dielectric layer MCD-1, the first stacked insulating structure 140, the first gate insulating layer 142, the first charge trap layer 144, the first channel hole CH-1, the first channel layer 150, the first drain layer 170, the first filling insulating layer 160, the first word line cut region WLC-1, the first select line cut region SLC-1, the first select line SL-1, the first lower barrier line UBA-1, and the second lower barrier line LBA-1, which are included in the first memory stack ST1.

In the second memory stack ST2, the second drain layer 270 may be formed on the stack structure of the plurality of second insulating layer 232 and the plurality of second word line structure WL-2 so that the second drain layer 270 fills a lower portion of the second channel hole CH-2 and contacts the lower surface of the second channel layer 250.

The semiconductor memory device 3 according to the present inventive concept may stack a plurality of memory stacks including the first memory stack ST1 and the second memory stack ST2 in the vertical direction (Z direction), and may increase the capacity of data to be stored in the same area.

While the present inventive concept has been particularly shown and described with reference to embodiments thereof, it will be understood that various changes in form and details may be made therein without departing from the spirit and scope of the present inventive concept as defined by the appended claims.

What is claimed is:

1. A semiconductor memory device, comprising:
a semiconductor substrate;
a common source semiconductor layer doped with impurities of a first conductivity type and arranged on the semiconductor substrate;
a plurality of insulating layers and a plurality of word line structures alternately stacked on the common source semiconductor layer;
a memory cell dielectric layer penetrating the plurality of insulating layers and the plurality of word line structures and covering an internal wall of a channel hole, the channel hole extending in a vertical direction, and a memory cell structure filling the channel hole; and
an etch stop layer arranged directly between the semiconductor substrate and the common source semiconductor layer, the etch stop layer including an oxynitride,
wherein the memory cell structure comprises a channel layer and a drain layer, wherein the channel layer disposed on the memory cell dielectric layer and fills at least a portion of the channel hole, and the drain layer covering an upper surface of the channel layer, doped with impurities of a second conductivity type, and filling some of an upper portion of the channel hole,
the memory cell dielectric layer comprises a gate insulating layer covering the internal wall of the channel hole, and a charge trap layer arranged between the gate insulating layer and the channel layer, and
the channel hole penetrates the plurality of insulating layers, the plurality of word line structures, and the etch stop layer.

2. The semiconductor memory device of claim 1, wherein the charge trap layer comprises a material having trap site density and permittivity higher than those of a material included in the gate insulating layer.

3. The semiconductor memory device of claim 1, wherein the plurality of word line structures comprise:
a select line separated by a select line cut region, the select line cut region extending in a first horizontal direction;
a first barrier line not being separated by the select line cut region; and
a second barrier line not being separated by the select line cut region and located below the first barrier line,
wherein a positive voltage is provided to one of the first barrier line and the second barrier line, and a negative voltage is provided to an other one of the first barrier line and the second barrier line.

4. The semiconductor memory device of claim 3, wherein the select line is an uppermost word line structure of the plurality of word line structures.

5. The semiconductor memory device of claim 3, wherein the select line is a lowermost word line structure of the plurality of word line structures.

6. The semiconductor memory device of claim 1, further comprising a filling semiconductor layer,
wherein the channel hole extends into the semiconductor substrate,
the filling semiconductor layer fills a lower portion of the channel hole extending into the semiconductor substrate, and
the filling semiconductor layer is apart from the channel layer with the common source semiconductor layer arranged therebetween.

7. The semiconductor memory device of claim 6, wherein the channel layer and the filling semiconductor layer comprise an intrinsic semiconductor material.

8. The semiconductor memory device of claim 6, further comprising: a barrier insulating layer arranged between the filling semiconductor layer and the semiconductor substrate, the barrier insulating layer comprising a material identical to that of the memory cell dielectric layer.

9. The semiconductor memory device of claim 1, wherein the common source semiconductor layer comprises:
a base source layer extending in a horizontal direction between a lowermost insulating layer of the plurality of insulating layers and the etch stop layer; and
a cell source layer extending from the base source layer, comprising an upper surface contacting a lower surface of the channel layer, and arranged in the channel hole.

10. The semiconductor memory device of claim 9, wherein the base source layer has an upper surface having a vertical level identical to that of a lower surface of the lowermost insulating layer of the plurality of insulating layers, and extends in the horizontal direction, and
a vertical level of the upper surface of the cell source layer is higher than that of the upper surface of the base source layer.

11. A semiconductor memory device, comprising:
a semiconductor substrate;
a plurality of memory cell structures each comprising a cell source layer, a channel layer, and a drain layer sequentially stacked from the semiconductor substrate in a vertical direction, and each having a vertical pillar shape extending in the vertical direction;
a plurality of word line structures being apart from each other in the vertical direction and surrounding the plurality of memory cell structures;
a plurality of memory cell dielectric layers each interposed between the channel layer of a corresponding one of the plurality of memory cell structures and a corresponding one of the plurality of word line structures; and
a plurality of bit lines each electrically connected to the drain layer of each of the plurality of memory cell structures, respectively, extending in a first horizontal direction on the plurality of word line structures, and having a certain distance from each other in a second horizontal direction orthogonal to the first horizontal direction,
wherein the drain layer is doped with impurities of a first conductivity type,
the cell source layer is doped with impurities of a second conductivity type different from the first conductivity type,
each of the plurality of memory cell dielectric layers comprises:
a gate insulating layer covering the plurality of word line structures; and
a charge trap layer arranged between the gate insulating layer and the channel layer, and
each of the plurality of memory cell structures comprises a volatile memory device having a thyristor structure.

12. The semiconductor memory device of claim 11, further comprising a base source layer arranged on the semiconductor substrate, the base source layer connecting one of the cell source layers to an other one of the cell source layers next to the one of the cell source layers, and doped with the impurities of the second conductivity type.

13. The semiconductor memory device of claim 12, wherein a lower surface of the cell source layer is located at a level lower than that of a lower surface of the base source layer, and an upper surface of the cell source layer is located at a level higher than that of an upper surface of the base source layer.

14. The semiconductor memory device of claim 12, further comprising:
an etch stop layer arranged on the semiconductor substrate, and
a buried insulating layer penetrating the plurality of word line structures and the base source layer, extending in the second horizontal direction, and filling a word line cut region to expose a portion of the etch stop layer.

15. The semiconductor memory device of claim 11, further comprising a filling semiconductor layer arranged in the semiconductor substrate and comprising an upper surface in contact with a lower surface of the cell source layer.

16. The semiconductor memory device of claim 15, further comprising a barrier insulating layer arranged between the filling semiconductor layer and the semiconductor substrate, and surrounding a side surface and a lower surface of the filling semiconductor layer.

17. A semiconductor memory device, comprising:
a semiconductor substrate;
an etch stop layer arranged on the semiconductor substrate, the etch stop layer including an oxynitride;
a common source semiconductor layer doped with impurities of a first conductivity type and arranged on the semiconductor substrate;
a plurality of insulating layers and a plurality of word line structures alternately stacked on the common source semiconductor layer;
a memory cell dielectric layer comprising a gate insulating layer and a charge trap layer sequentially covering an internal sidewall of each of a plurality of channel holes, wherein the plurality of channel holes penetrate the plurality of insulating layers, the plurality of word line structures, and the etch stop layer in a vertical direction, and extend into the semiconductor substrate;
a plurality of memory cell structures each comprising:
a filling semiconductor layer arranged on a barrier insulating layer, the filling semiconductor layer located apart from the memory cell dielectric layer and filling some of a lower portion of each of the plurality of channel holes;
a channel layer arranged on the memory cell dielectric layer, being apart from the filling semiconductor layer with the common source semiconductor layer arranged therebetween, filling a first region of an upper portion of each of the plurality of channel holes, and comprising a material identical to that of the filling semiconductor layer; and
a drain layer covering an upper surface of the channel layer, filling a second region of the upper portion of each of the plurality of channel holes, and doped with impurities of a second conductivity type different from the first conductivity type; and
a plurality of bit lines each electrically connected to the drain layer of each of the plurality of memory cell structures, respectively, extending on the plurality of memory cell structures in a first horizontal direction, and having a certain distance from each other in a second horizontal direction orthogonal to the first horizontal direction.

18. The semiconductor memory device of claim 17, wherein the charge trap layer comprises a material having trap site density and permittivity higher than those of a material included in the gate insulating layer, and
the common source semiconductor layer comprises:
a cell source layer comprising an upper surface in contact with a lower surface of the channel layer in each of the plurality of channel holes; and
a base source layer connecting one of the cell source layers to an other one of the cell source layers next to the one of the cell source layers, the base source layer arranged between a lowermost insulating layer of the plurality of insulating layers and the etch stop layer, and having an upper surface at a vertical level lower than that of the upper surface of the cell source layer.

* * * * *